(12) United States Patent
Okutoh et al.

(10) Patent No.: US 6,180,974 B1
(45) Date of Patent: Jan. 30, 2001

(54) SEMICONDUCTOR STORAGE DEVICE HAVING A CAPACITOR ELECTRODE FORMED OF AT LEAST A PLATINUM-RHODIUM OXIDE

(75) Inventors: Akira Okutoh, Kobe; Masaya Nagata, Nara; Shun Mitarai, Tenri; Yasuyuki Itoh, Yokohama, all of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 08/986,333

(22) Filed: Dec. 5, 1997

(30) Foreign Application Priority Data

| Dec. 6, 1996 | (JP) | 8-327153 |
|---|---|---|
| Jun. 5, 1997 | (JP) | 9-147863 |

(51) Int. Cl.$^7$ ............................................. H01L 27/108
(52) U.S. Cl. ............................................. 257/306; 257/768
(58) Field of Search .............................. 257/306, 768, 257/769

(56) References Cited

U.S. PATENT DOCUMENTS

| 5,003,428 | * | 3/1991 | Shepard | 361/321 |
|---|---|---|---|---|
| 5,005,102 | | 4/1991 | Larson . | |
| 5,053,917 | * | 10/1991 | Miyasaka et al. | 361/321 |
| 5,142,437 | | 8/1992 | Kammerdiner et al. . | |
| 5,185,689 | | 2/1993 | Maniar . | |
| 5,335,138 | * | 8/1994 | Sandhu et al. | 257/306 |
| 5,407,855 | | 4/1995 | Mania et al. . | |
| 5,555,486 | | 9/1996 | Kingon et al. . | |
| 5,567,964 | | 10/1996 | Kashihara et al. . | |
| 5,622,893 | * | 4/1997 | Summerfelt et al. | 438/396 |
| 5,701,647 | * | 12/1997 | Saenger et al. | 437/919 |
| 5,714,402 | * | 2/1998 | Choi | 437/60 |
| 5,717,236 | * | 2/1998 | Shinkawata | 257/306 |
| 5,790,366 | * | 8/1998 | Desu et al. | 257/306 |

FOREIGN PATENT DOCUMENTS

| 05343251 | 12/1993 | (JP) . |
|---|---|---|
| 6-326249 | 11/1994 | (JP) . |
| 7-94680 | 4/1995 | (JP) . |
| 7-99290 | 4/1995 | (JP) . |
| 8-51165 | 2/1996 | (JP) . |
| 9-45872 | 2/1997 | (JP) . |

* cited by examiner

*Primary Examiner*—David Hardy
(74) *Attorney, Agent, or Firm*—Nixon & Vanderhye P.C.

(57) ABSTRACT

In a semiconductor storage device in a stack structure wherein a capacitor section having an upper electrode, a dielectric layer, and a lower electrode is connected with a transistor section by a plug, the lower electrode is formed in contact with the plug. The lower electrode is formed of at least an oxide of a platinum-rhodium alloy. In addition to the oxide of a platinum-rhodium alloy, platinum and/or a platinum-rhodium alloy can be used as materials for forming the lower electrode. The plug is formed of polysilicon or tungsten. When the plug is formed of polysilicon, the lower electrode is formed by sequentially laminating, for example, a film of the oxide of the platinum-rhodium alloy, a film of the platinum-rhodium alloy, and a film of the oxide of the platinum-rhodium alloy on the plug.

40 Claims, 12 Drawing Sheets

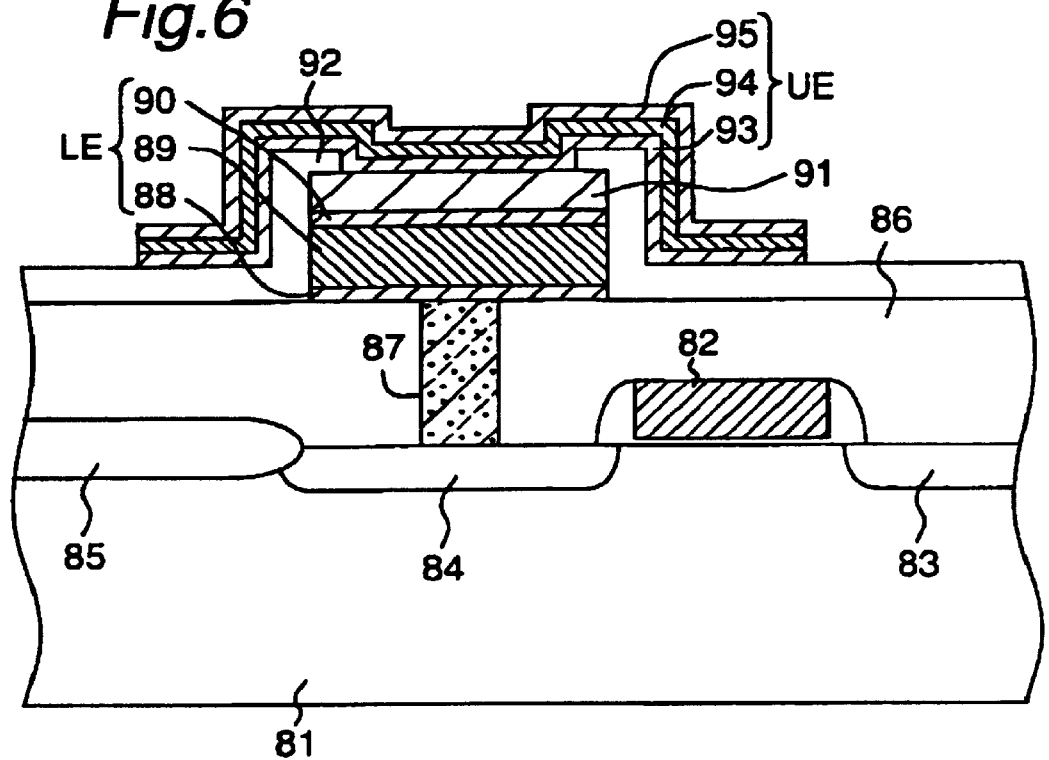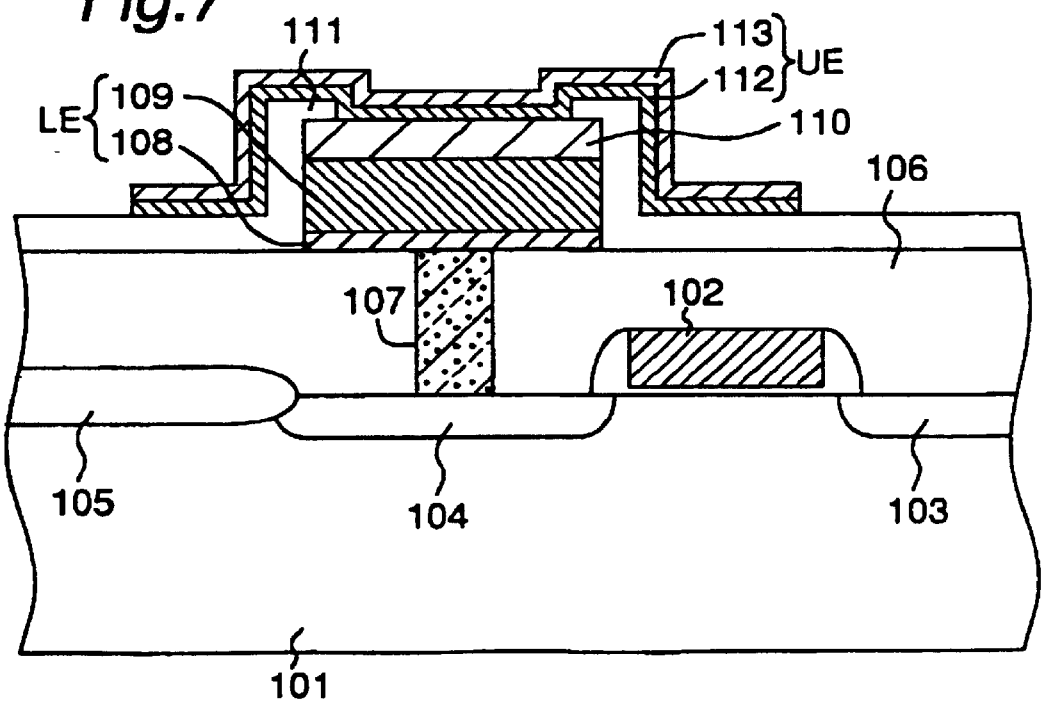

SEMICONDUCTOR STORAGE DEVICE HAVING A CAPACITOR ELECTRODE FORMED OF AT LEAST A PLATINUM-RHODIUM OXIDE

BACKGROUND OF THE INVENTION

The present invention relates to a semiconductor storage device and a method of manufacturing the same. More particularly, the present invention relates to an electrode construction for a capacitor section in a cell of a ferroelectric memory and that of a high dielectric memory.

In recent years, dynamic random access memory (DRAM) cells each constructed of one MOS (metal oxide film semiconductor) transistor and one capacitor are mainly manufactured. With demands for high integration and fine processability in recent years, it has become more and more difficult to secure the capacity of a cell in the DRAMs having such a construction. Therefore, generally, efforts are made to develop methods of increasing the area of an electrode to secure the cell capacity.

Increasing the area of the electrode to secure the capacity of the cell is realized by constructing the electrode in a three-dimensional structure. However, because this method causes the manufacturing process to be very complicated, attempts to increase the area of the electrode by this method have almost reached the limit. Therefore, if a circuit integration further progresses, it will be difficult to secure the capacity of the cell using this method. Further, attempts to make dielectrics thinner have almost reached the limit, too. Therefore, in order to secure the cell capacity, researches are being made to develop new methods of using an oxide having a high dielectric constant (hereinafter referred to as "high dielectric") such as $(Ba_xSr_{1-x})TiO_3$ ($0 \leq x \leq 1$) as a dielectric material.

In the meantime, with the progress of a thin film-forming technique, ferroelectric non-volatile memories (FeRAM) operating at a high density and speed are being developed by combining the thin film-forming technique and a semiconductor memory-fabricating technique with each other.

The researches of such ferroelectric non-volatile memories are energetically made for practical application because it is considered that due to their properties of high-speed write/read, operations at low voltages, and resistance to repeated write/read operations, the ferroelectric non-volatile memories will be able to replace not only the conventional non-volatile memories such as EPROMs (Erasable Programmable ROMs), EEPROMs (Electrically Erasable ROMs), and flash memories, but also SRAMs (static RAMs) and DRAMs (Dynamic RAMs).

the following substances have been investigated as a ferroelectric substance to be used in a capacitor section of such a non-volatile memory: $PbZr_xTi_{1-x}O_3$ ($0 \leq x \leq 1$) (hereinafter referred to as "PZT"), and $SrBi_2Ta_2O_9$ and $Bi_4Ti_3O_{12}$ which each have fatigue characteristics more favorable than the PZT and can be driven at low voltages.

However, in order to allow these ferroelectrics and the high dielectrics to display their characteristics fully, it is necessary to heat-treat them in an oxidizing atmosphere at a temperature of as high as 400° C.–800° C.

When forming a highly integrated DRAM or FeRAM having a stack construction by using the ferroelectric or high dielectric material, generally, a plug formed of polysilicon or the like is used to electrically connect a CMOS (complementary metal oxide semiconductor) section and a capacitor with each other. FIG. 17 shows an example of such a construction. Reference numeral 5 in FIG. 17 denotes a plug. A lower electrode 10 of the capacitor is formed of platinum (Pt) having a high degree of resistance to an oxidation reaction in forming a film at high temperatures.

In this case, it is necessary to form a barrier metal 11 made of a nitrided metal such as titanium nitride (TiN) between the lower electrode 10 of the capacitor and the plug 5. The barrier metal 11 serves to prevent Pt of the lower electrode 10 and polysilicon of the plug 5 from reacting with each other and also to prevent elements composing a ferroelectric film 8 (or a high dielectric film) from diffusing through the lower electrode 10 to the CMOS section in a heat-treating process.

In FIG. 17, reference numeral 1 denotes a silicon substrate, reference numeral 2 denotes a gate electrode, reference numeral 3 denotes a source region, reference numeral 4 denotes a drain region, reference numeral 6 denotes a LOCOS (LOCal Oxidation of Silicon) oxide film, reference numerals 7 and 9 denote interlaminar insulation films, and reference numeral 12 denotes an upper electrode of the capacitor section.

However, the semiconductor storage device having the CMOS section and the capacitor section electrically connected by the plug 5 as shown in FIG. 17 has the following problems:

That is, it is necessary that the barrier metal 11 has a thickness of about 2000 Å to prevent the elements of the ferroelectric film 8 from diffusing into other films in a heat-treating process. Consequently, the total of the thickness of the barrier metal 11 and that (1000 Å) of the lower electrode 10 is about 3000 Å. Therefore, the total thickness of the capacitor section including the thickness of the dielectric substance 8 is very great, so that there is necessarily a big difference in level, or unevenness, in the capacitor section.

Therefore, in forming a contact hole in the interlaminar insulation film 9 and forming metal wiring after the interlaminar insulation film 9 is formed, errors occur due to a great difference in level, or unevenness, of the capacitor in a photolithographic process used for the fine processing. Thus, materials cannot be processed submicroscopically.

Further, in the case of the barrier metal 11 formed of TiN, as described above, Tin is easily oxidized by oxygen included in an atmosphere and permeating through Pt of the lower electrode 10 during the heat=treatment of the ferroelectric substance 8 (or a high dielectric). Consequently, a volume change and a film stress occur, which results in separation of the TiN (barrier metal 11) from the Pt (lower electrode 10) and which will cause hillocks and cracks in the Pt (lower electrode 10).

SUMMARY OF THE INVENTION

It is an object of the present invention to provide a semiconductor storage device having a structure which allows the lower electrode of the capacitor section and the plug to tightly contact each other and which can eliminate the drawbacks caused by a difference in level, or projection, of the capacitor section in the processing time. It is also an object of the invention to provide a method of manufacturing such a semiconductor storage device.

In order to achieve the object, the present invention provides a semiconductor storage device having a stack construction and comprising a capacitor section having an upper electrode, a dielectric layer, and a lower electrode, and a transistor section connected with the capacitor section with a plug. The lower electrode is formed directly on the plug, and formed of at least one of platinum, a platinum-rhodium alloy, and an oxide of the platinum-rhodium alloy. The at least one is the oxide of the platinum-rhodium alloy.

According to this construction, the oxide of the platinum-rhodium alloy constituting a part of the lower electrode of the capacitor section prevents an oxygen atmosphere from permeating through the lower electrode to the polysilicon plug in forming the dielectric layer on the lower electrode. Thus, the surface of the polysilicon plug is prevented from being oxidized and thus a close contact is obtained between the transistor section and the capacitor section.

Consequently, it is unnecessary to provide the capacitor section with a barrier metal used to prevent the lower electrode and the polysilicon plug from reacting with each other. Accordingly, the capacitor section has a reduced unevenness. This allows the fine processing for the capacitor section to be accomplished with high accuracy.

Materials of the plug may include polysilicon and tungsten.

The semiconductor storage device having the above construction can be manufactured by a method comprising, for example, the steps of:

forming a transistor on a silicon substrate and covering the transistor with an interlaminar insulation film;

forming a contact hole communicating with a drain region of the transistor in the interlaminar insulation film and filling the contact hole with a material of a plug so as to form the plug;

forming directly on the plug a lower electrode of at least one of platinum, a platinum-rhodium alloy and an oxide of the platinum-rhodium alloy, the at least one being the oxide of the platinum-rhodium alloy;

performing heat treatment in a nitrogen atmosphere; and forming a dielectric layer on the lower electrode and then forming an upper electrode on the dielectric layer.

According to the manufacturing method, the lower electrode is heat-treated in the nitrogen atmosphere. Thus, the lower electrode has an improved crystallizability and the dielectric layer formed on the lower electrode has a reduced leakage current.

It is preferable that the above heat treatment of the lower electrode in the nitrogen atmosphere is carried out at 400° C.–700° C. to improve the crystallizability of the lower electrode reliably.

In an embodiment, the plug is formed of polysilicon, and the lower electrode includes a film of the oxide of platinum-rhodium alloy, a film of the platinum-rhodium alloy, and a film of the oxide of the platinum-rhodium alloy which are sequentially stacked in this order on the plug.

According to this construction, the two layers each consisting of the film of the oxide of the platinum-rhodium alloy prevent the permeating of an oxygen atmosphere efficiently in forming the dielectric layer.

The semiconductor storage device according to the above embodiment can be manufactured by a method comprising, for example, the steps of:

forming a transistor on a silicon substrate and covering the transistor with an interlaminar insulation film;

forming a contact hole communicating with a drain region of the transistor in the interlaminar insulation film and filling the contact hole with polysilicon so as to form a polysilicon plug;

sequentially forming a film of an oxide of a platinum-rhodium alloy and a film of a platinum-rhodium alloy directly on the polysilicon plug, the film of the oxide of the platinum-rhodium alloy and the film of the platinum-rhodium alloy composing a part of a lower electrode;

oxidizing a surface of the film of the platinum-rhodium alloy by performing heat treatment in oxygen atmosphere to form a layer of an oxide of the platinum-rhodium alloy so as to complete the lower electrode; and forming a dielectric layer on the lower electrode and then forming an upper electrode on the dielectric layer.

In this manufacturing method, the film of the platinum-rhodium alloy is heat-treated in the oxygen atmosphere to oxidize its surface thereby to form the film of the oxide of the platinum-rhodium alloy as the uppermost layer of the lower electrode. Thus, the lower electrode can be formed in a reduced number of film-forming steps.

In this case, preferably, the thickness of the film of the oxide of the platinum-rhodium alloy formed in contact with the polysilicon plug may be set to 100 Å–500 Å, the thickness of the film of the platinum-rhodium alloy formed on the film of the oxide of the platinum-rhodium alloy may be set to 200 Å–1000 Å, and the thickness of the film of the oxide of the platinum-rhodium alloy formed on the film of the platinum-rhodium alloy may be set to 200 Å–1000 Å.

According to this construction, the two layers each consisting of the film of the oxide of the platinum-rhodium alloy prevent the permeation of the oxygen atmosphere reliably in forming the dielectric layer, the leakage current characteristics of the dielectric layer are optimumly held, and the unevenness, or difference in level, of the capacitor section is reduced.

Preferably, the heat treatment of the lower electrode in the oxygen atmosphere may be performed at 400° C.–700° C. to optimumly form the film of the oxide of the platinum-rhodium alloy on the surface of the film of the platinum-rhodium alloy.

The lower electrode may be formed of the film of the oxide of the platinum-rhodium alloy at the polysilicon plug side and the film of the platinum-rhodium alloy laminated thereon. In this case, because the lower electrode is formed of only two layers, the film-forming process for the lower electrode is simplified.

Similar to the foregoing case, the thickness of the film of the oxide of the platinum-rhodium alloy formed in contact with the polysilicon plug may be preferably set to 100 Å–500 Å, and the thickness of the film of the platinum-rhodium alloy formed thereon may be preferably set to 200 Å–1000 Å.

According to this construction, the film of the oxide of the platinum-rhodium alloy prevents the permeation of the oxygen atmosphere reliably in forming the dielectric layer, the leakage current characteristics of the dielectric layer are optimumly held, and the unevenness of the capacitor section is reduced.

The lower electrode may be formed of only the film of the oxide of the platinum-rhodium alloy, which simplifies the film-forming process for the lower electrode. In this case, it is preferable that the thickness of the film of the oxide of the platinum-rhodium alloy is set to 500 Å–2000 Å, which prevents the permeation of the oxygen atmosphere reliably in forming the dielectric layer, and forms the capacitor section having a reduced difference in level, or unevenness.

In each embodiment of the present invention, the film of the oxide of the platinum-rhodium alloy formed in contact with the polysilicon plug may include an oxygen content of, preferably, 2%–30%.

With this construction, the morphology of the oxide of the platinum-rhodium alloy constituting a part or the entirety of the lower electrode is prevented from deteriorating. Thus, the crystallizability of the dielectric layer formed on the lower electrode does not become unfavorable, and the permeation of the oxygen atmosphere in forming the dielectric layer is securely prevented.

The lower electrode may be formed by laminating the film of the platinum-rhodium alloy, the film of the oxide of the platinum-rhodium alloy, and the film of the platinum-rhodium alloy sequentially in this order from the plug side. In this arrangement, because the platinum-rhodium alloy is formed directly on the plug (for example, a polysilicon plug), the plug and the lower electrode contact each other closely, which allows a close contact between the transistor section and the capacitor section.

In this case, the thickness of the film of the platinum-rhodium alloy formed in contract with the plug may be preferably 100 Å–1000 Å, the thickness of the film of the oxide of the platinum-rhodium alloy formed on the film of the platinum-rhodium alloy may be preferably 100 Å–800 Å, and the thickness of the film of the platinum-rhodium alloy formed on the oxide of the platinum-rhodium alloy may be preferably 200 Å–500 Å. According to the construction, the film of the oxide of the platinum-rhodium alloy prevents the permeation of the oxygen atmosphere reliably in forming the dielectric layer. Therefore, the film of the platinum-rhodium alloy constituting the lowermost layer of the lower electrode contacts the plug closely. Also, the capacitor section has a reduced unevenness.

The lower electrode may be formed by sequentially laminating the film of the platinum-rhodium alloy and the film of the oxide of the platinum-rhodium alloy in this order on the plug. In this construction, because the platinum-rhodium metal is formed directly on the plug (for example, a polysilicon plug), the plug and the lower electrode contact each other closely, which allows a close contact between the transistor section and the capacitor section.

In this case, the thickness of the film of the platinum-rhodium alloy formed in contact with the plug may be set to, preferably, 100 Å–1000 Å, and the thickness of the film of the oxide of the platinum-rhodium alloy formed thereon may be set to, preferably, 100 Å–800 Å. According to the construction, the film of the oxide of the platinum-rhodium alloy prevents the permeation of the oxygen atmosphere reliably in forming the dielectric layer. Also, the film of the platinum-rhodium alloy forming a lowermost layer of the lower electrode closely contacts the plug reliably. Also, the capacitor section has a reduced unevenness.

The semiconductor storage device whose lower electrode is formed of the film of the platinum-rhodium alloy and the film of the oxide of the platinum-rhodium alloy can be also manufactured by a method comprising, for example, the steps of:

forming a transistor on a silicon substrate and covering the transistor with an interlaminar insulation film;

forming a contact hole communicating with a drain region of the transistor in the interlaminar insulation film and filling the contact hole with polysilicon so as to form a plug;

forming a film of a platinum-rhodium alloy on the plug, the film of the platinum-rhodium alloy forming a part of a lower electrode; and oxidizing a surface of the film of the platinum-rhodium alloy by performing heat treatment in an oxygen atmosphere to form a film of an oxide of the platinum-rhodium alloy on the film of the platinum-rhodium alloy to thereby complete the lower electrode; and forming a dielectric layer on the lower electrode and then forming an upper electrode on the dielectric layer.

In this manufacturing method, the film of the oxide of the platinum-rhodium alloy is formed by performing a heat treatment after the film of the platinum-rhodium alloy is formed. Thus, the lower electrode can be formed in a small number of film-forming steps.

In this case, the thickness of the film of the platinum-rhodium alloy formed in contact with the plug may be set to, preferably, 500 Å–2000 Å. By so doing, the film of the platinum-rhodium alloy constituting a lowermost layer of the lower electrode is allowed to contact the plug closely. Also, the capacitor section has a reduced unevenness.

The lower electrode may be formed by sequentially laminating a platinum film, a film of the oxide of the platinum-rhodium alloy, and a platinum film in this order on the plug (for example, a polysilicon plug). In this construction, because a platinum film is formed directly on the plug, the plug and the lower electrode are capable of contacting each other closely, which allows a preferable contact to be accomplished between the transistor section and the capacitor section.

In this case, the thickness of the platinum film formed in contact with the plug may be set to, preferably, 100 Å–1000 Å, the thickness of the film of the oxide of the platinum-rhodium alloy may be set to, preferably, 100 Å–800 Å, and the thickness of the other platinum film may be set to, preferably, 200 Å–500 Å. According to the construction, the film of the oxide of the platinum-rhodium alloy prevents the permeation of the oxygen atmosphere reliably in forming the dielectric layer, and the platinum constituting a lowermost layer of the lower electrode and the plug are capable of contacting closely each other reliably. Further, the capacitor section has a reduced unevenness.

The platinum film on the film of the oxide of the platinum-rhodium alloy may be omitted. In this case, the process of forming the lower electrode is simplified.

Tungsten is less reactive with platinum than silicon is. Thus, when the plug is formed of tungsten, the element of the plug does not react with platinum of the platinum film and the platinum-rhodium alloy film in a process of forming the platinum film and the platinum-rhodium alloy film and in a process of heat-treating the dielectric layer.

In an embodiment, the lower electrode includes one of a film of platinum and a film of the platinum-rhodium alloy, and a film of the oxide of a platinum-rhodium alloy which are sequentially formed on the tungsten plug.

According to this construction, the platinum film or the film of the platinum-rhodium alloy constituting a lower layer of the lower electrode prevents the diffusion of oxygen to the tungsten plug side from the film of the oxide of the platinum-rhodium alloy which constitutes an upper layer of the lower electrode. Thus, the capacitor section and the transistor section contact each other further closely.

The lower electrode may further include one of a film of platinum and a film of a platinum-rhodium alloy on the film of the oxide of the platinum-rhodium alloy.

According to this construction, an uppermost layer of the lower electrode is formed of the metal film containing platinum having an orientation (111). Accordingly, the crystallizability of the dielectric layer formed on the lower electrode is improved. Thus, the ferroelectric property and the leakage current characteristics are improved.

BRIEF DESCRIPTION OF THE DRAWINGS

FIG. 6 is a sectional view showing a fourth embodiment of the semiconductor storage device of the present invention;

FIG. 7 is a sectional view showing a fifth embodiment of the semiconductor storage device of the present invention;

DETAILED DESCRIPTION OF THE PREFERRED EMBODIMENTS

The present invention will be described in detail below with reference to the drawings.

Rhodium oxide (RhOx) has a high degree of electrical conductivity (electric resistivity: 50–200 $\mu\Omega$cm) and has the property of preventing diffusion of impurities. In particular, the rhodium oxide serves as a barrier to oxygen diffusion.

Therefore, according to the present invention, a lower electrode of a capacitor section is formed of at least an oxide of a platinum-rhodium alloy (PtRhOx) to prevent a plug from being oxidized in forming a ferroelectric layer (or a high dielectric layer). In addition to the essential PtRhOx, platinum (Pt) and/or an alloy of platinum and rhodium (PtRh) may be used as materials of the lower electrode. The structure allows the capacitor section and a CMOS section to contact each other preferably and eliminates the need for the formation of a barrier metal such as TiN between the lower electrode and the plug, thus allowing the difference in level, or a surface unevenness, of the capacitor section to be small.

First Embodiment

Figure 1:
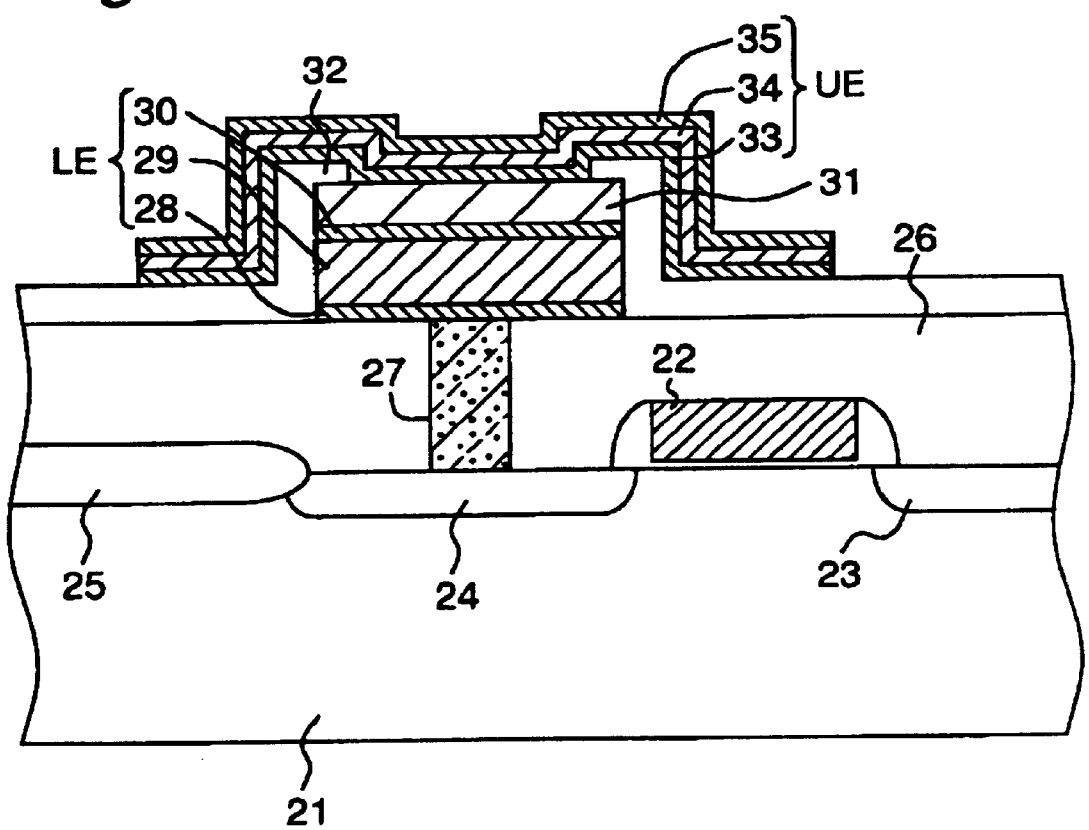
FIG. 1 is a sectional view showing a first embodiment of the semiconductor storage device of the present invention.

FIG. 1 is a sectional view showing a semiconductor storage device of the first embodiment.

In the semiconductor storage device, a MOS transistor (which is one of MOS transistors constituting a CMOS transistor, and the other MOS transistor is not shown) having a gate electrode 22, a source region 23, and a drain region 24 is formed on a silicon substrate 21 and covered by an interlaminar insulation film 26. Reference numeral 25 denotes a LOCOS (Local Oxidation of Silicon) oxide film 25. A polysilicon plug 27 connecting the CMOS with a capacitor section is formed in the interlaminar insulation film 26.

The capacitor section has three films 28, 29, and 30 (hereinafter each film referred to as lower electrode) composing a lower electrode LE thereof and sequentially laminated over the interlaminar insulation film 26 such that the lower elected LE is positioned on the polysilicon plug 27. The capacitor section also has a ferroelectric thin film 31 formed on the uppermost-layer lower electrode 30. An interlaminar insulation film 32 covers walls of the lower electrodes 28, 29, and 30 and the ferroelectric thin film 31, and an upper surface of the interlaminar insulation film 26. Films 33, 34, and 35 (hereinafter each film referred to as upper electrode) composing an upper electrode UE are sequentially laminated in an upper position of the capacitor section.

The semiconductor storage device having the above construction is formed by the following procedure.

Initially, the LOCOS oxide film 25 for element isolation is formed to a thickness of 5000 Å on the P-type silicon substrate 21. Then, by ion implantation, the source region 23 and the drain region 24 of the CMOS transistor are formed. Then, the gate electrode 22 is formed.

In order to form the capacitor section having a stack structure, a silicon oxide film having a thickness of 5000 Å is formed by a CVD (chemical vapor deposition) method to form the interlaminar insulation film 26. Thereafter, a contact hole having a diameter of 0.5 $\mu$m is formed in the interlaminar insulation film 26 and then polysilicon is filled in the contact hole using the CVD method. Then, the surface of the polysilicon is flattened by a chemical mechanical polishing (CMP) method. Thus, the polysilicon plug 27 is completed.

As the lowermost-layer lower electrode 28, a PtRhOx film having a thickness of 100 Å–500 Å (preferably, 200 Å) is formed directly on the polysilicon plug 27 at 250° C. by means of a DC magnetron reactive sputtering method. As the intermediate-layer lower electrode 29, a PtRh film having a thickness of 200 Å–1000 Å (preferably, 800 Å) is formed on the lowermost-layer lower electrode 28 at 250° C. by means of the DC magnetron reactive sputtering method. As the uppermost-layer lower electrode 30, a PtRhOx film having a thickness of 200Å–1000 Å (preferably, 300 Å) is formed on the intermediate-layer lower electrode 29 at 250° C. by means of the DC magnetron reactive sputtering method. The three lower electrodes 28, 29, and 30 are successively formed by changing the flow ratio of argon to oxygen.

Figure 17:
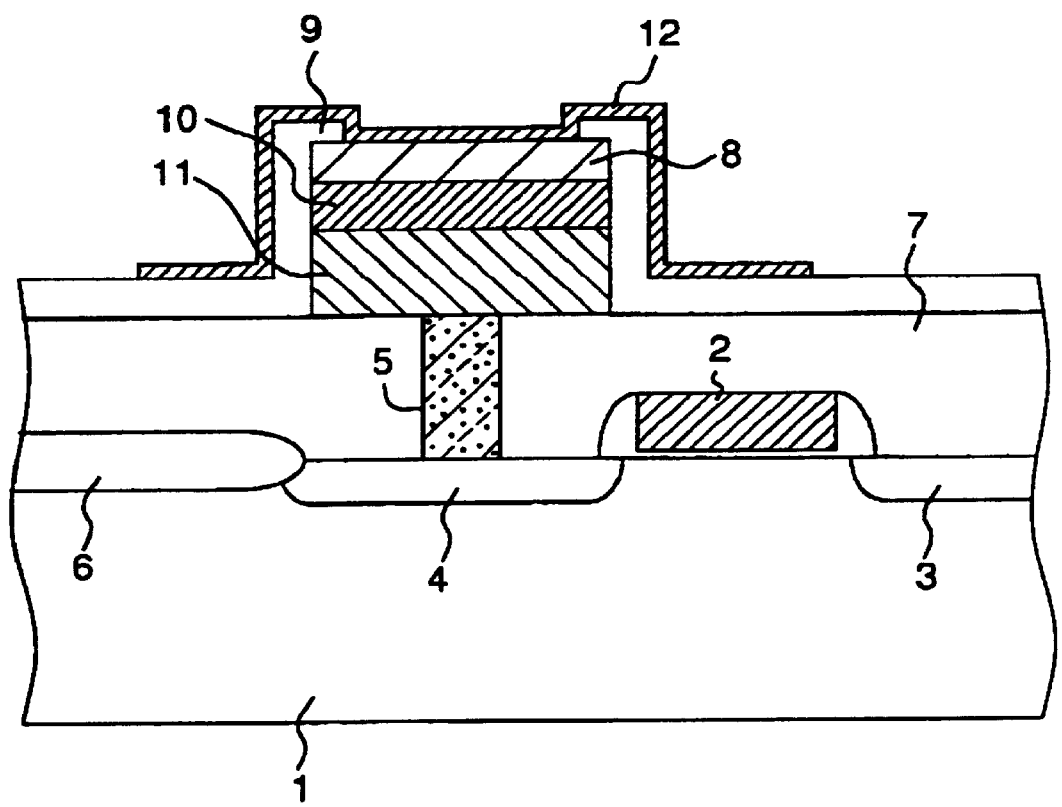
FIG. 17 is a sectional view showing the conventional semiconductor storage device in which a CMOS section and a capacitor section are electrically connected with each other with a polysilicon plug.

The optimum thickness of the lower electrode EL consisting of the lower electrodes 28, 29, and 30 is as thin as 1300 Å, about half of 3000 Å which is the sum of the barrier metal 11 made of TiN and the lower electrode 10 of the conventional semiconductor storage device shown in FIG. 17. Even the greatest thickness, namely, 2500 Å of the lower electrode EL is smaller than 3000 Å which is the sum of the barrier metal 11 made of TiN and the lower electrode 10 of the conventional semiconductor storage device.

Accordingly, the difference in level of the capacitor section is allowed to be smaller than that of the conventional capacitor section, which prevents errors from occurring in a photolithographic process carried out for finely processing a contact hole in the interlaminar insulation film 32 and metal wiring for the upper electrodes 33, 34, and 35.

Thereafter, a PZT thin film having a thickness of 200 Å is formed as the ferroelectric thin film 31 by a sol-gel method. Then, the PZT thin film is annealed in an atmosphere of combined oxygen and nitrogen at 600° C. for 30 seconds, using a rapid thermal annealing (RTA) device.

Then, the ferroelectric thin film (PZT thin film) 31 and the lower electrodes 28, 29, and 30 thus formed are processed by a dry etching method into the size of, for example, 3.0 μm square. Then, a silicon oxide film is formed as the interlaminar insulation film 32 by the CVD method. Then, a contact hole is formed through the interlaminar insulation film 32 such that the contact hole is positioned on the ferroelectric thin film 31.

Then, as the lowermost-layer upper electrode 33, a PtRhOx film having a thickness of 200 Å–1000 Å (preferably, 300 Å) is formed in an upper position of the capacitor section at 250° C. by means of the DC magnetron reactive sputtering method. As the intermediate-layer upper electrode 34, a PtRh film having a thickness of 200 Å–1000 Å (preferably, 800 Å) is formed on the upper electrode 33 at 250° C. by means of the DC magnetron sputtering method. As the uppermost-layer upper electrode 35, a PtRhOx film having a thickness of 100 Å–500 Å (preferably, 200 Å) is formed on the upper electrode 34 at 250° C. by means of the DC magnetron reactive sputtering method.

Then, the upper electrodes 33, 34, and 35 are processed by the dry etching method. Finally, a lead electrode of the source region 23 of the CMOS section is formed.

If the PtRhOx film forming the lowermost-layer lower electrode 28 has a thickness of less than 100 Å, an oxygen gas atmosphere permeates into the polysilicon plug 27 and oxidizes the polysilicon in forming the ferroelectric thin film 31 by the sol-gel method. Thus, a good contact between the CMOS section and the capacitor section is not obtained. If the PtRhOx film forming the lowermost-layer lower electrode 28 has a thickness of more than 500 Å, the total thickness of the capacitor section increases, which is unpreferable. If the film-forming temperature is 450° C. or more, the surface of the polysilicon plug 27 is oxidized in an oxygen plasma atmosphere in forming the PtRhOx film. Consequently, it is impossible to obtain a good contact between the polysilicon plug 27 and the lowermost-layer lower electrode 28.

If the percentage of an oxygen content to all the elements in the PtRhOx film is over 30%, the morphology of the PtRhOx film becomes unfavorable rapidly and thus the crystallizability of the ferroelectric thin film 31 formed thereon becomes unfavorable. As a result, the leakage current characteristic of the capacitor section becomes very bad. If the percentage of the oxygen content is below 2%, the oxygen gas atmosphere used in forming the ferroelectric thin film 31 permeates into the polysilicon plug 27, thus oxidizing the polysilicon and preventing a preferable contact between the CMOS section and the capacitor section from being obtained.

If the PtRh film forming the intermediate-layer lower electrode 29 has a thickness of less than 200 Å, the leakage current characteristic value of the ferroelectric thin film 31 becomes greater by about one figure. If the PtRh film forming the intermediate-layer lower electrode 29 has a thickness of more than 100 Å, the entire thickness of the capacitor section increases, which is unpreferable.

The ratio between the elements of the PtRh film thus formed is 90:10.

If the PtRhOx film forming the uppermost-layer lower electrode 30 has a thickness of less than 200 Å, an oxygen gas atmosphere used in forming the ferroelectric thin film 31 permeates to the polysilicon plug 27 side, thus oxidizing the polysilicon and preventing a good contact from being made between the CMOS section and the capacitor section. Further, the fatigue characteristic caused by polarization inversion was as low as 42% of an initial value after $10^{11}$ cycles when a stress pulse having a frequency of 100 kHz, a duty ration of 5%, and a voltage of 5 V was applied to the ferroelectric thin film 31. If the uppermost-layer lower electrode 30 is formed of a PtRhOx film in a thickness of 1000 Å or more, the total thickness of the capacitor section increases, which is unpreferable.

Figure 2:
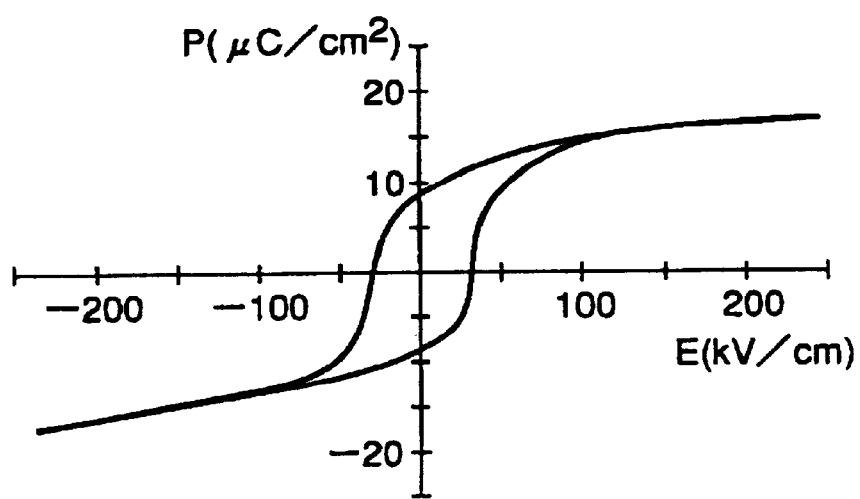
FIG. 2 is a graph showing a ferroelectric characteristic of the semiconductor storage device shown in FIG. 1.

A voltage pulse was applied between the lead electrode of the source region 23 and the upper electrodes 33, 34, and 35 of the ferroelectric substance-provided capacitor section of the semiconductor storage device formed by the above method in order to determine the ferroelectric characteristic (the electric field-polarization characteristic). As a result, as shown in FIG. 2, a hysteresis loop was obtained which has a ferroelectric characteristic value great enough to be used as the ferroelectric capacitor which has a favorable symmetry.

The above result indicates that such a separation as seen between the TiN (barrier metal 11) and the Pt (lower electrode 10) in the conventional semiconductor storage device shown in FIG. 17 does not occur in the semiconductor storage device of the present invention, and that the polysilicon plug 27 and the lower electrodes 28, 29, and 30 contact each other closely.

Figure 3:
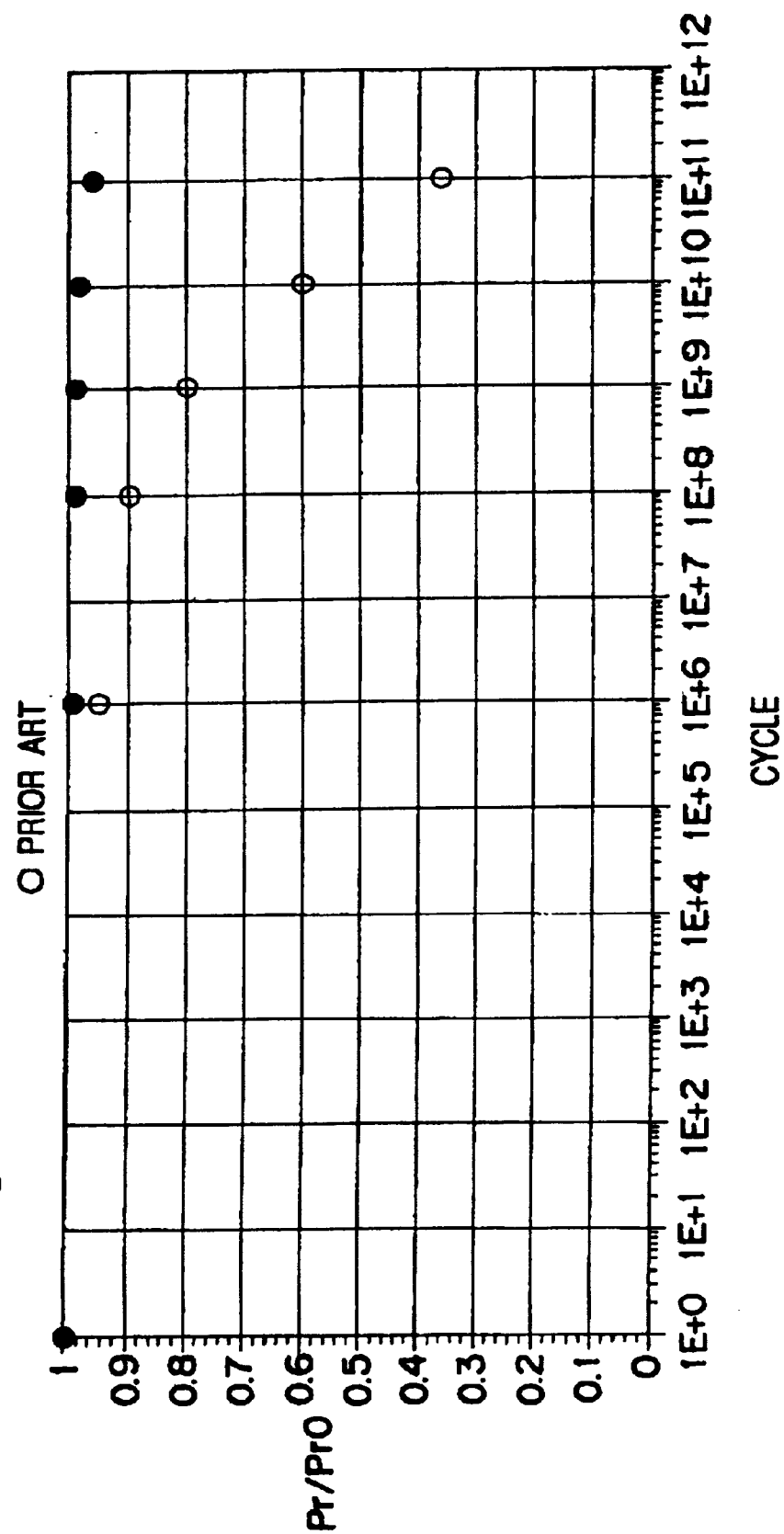
FIG. 3 is a graph showing a fatigue characteristic accompanying the polarization inversion of the semiconductor storage device shown in FIG. 1.

FIG. 3 shows the fatigue characteristic of the device caused by polarization inversion when a stress pulse having a frequency of 100 kHz, a duty ratio of 5%, and a voltage of 5 V was applied between the upper electrodes 33, 34, and 35 and the lead electrode of the source region 23. The result was that the residual polarization value Pr was 96% of an initial value PrO even after $10^{11}$ cycles. This proves that the semiconductor storage of the present embodiment device has a considerably improved fatigue characteristic, as compared with the conventional semiconductor storage device in which the residual polarization value Pr drops to the low as 36%.

As described above, because the lower electrode LE formed directly on the polysilicon plug 27 consists of the three layers of the PtRhOx film, the PtRh film, and the PtRhOx film, the PtRhOx film prevents the oxygen gas atmosphere from diffusing to the polysilicon plug 27 when forming the ferroelectric thin film 31. Therefore, the surface of the polysilicon plug 27 is prevented from being oxidized and a close contact is accomplished between the CMOS section and the capacitor section.

Consequently, unlike the conventional semiconductor storage device, the semiconductor storage device of the present invention does not require a barrier metal made of TiN, which allows the difference in level of the capacitor section to be small. Accordingly, the drawbacks caused by such a difference in level are eliminated and the fine processing of the periphery of the capacitor section is accomplished efficiently.

Second Embodiment

The lower electrode LE consisting of the PtRhOx film, the PtRh film, and the PtRhOx film of the first embodiment can be formed by the method of the second embodiment as well.

Figure 4:
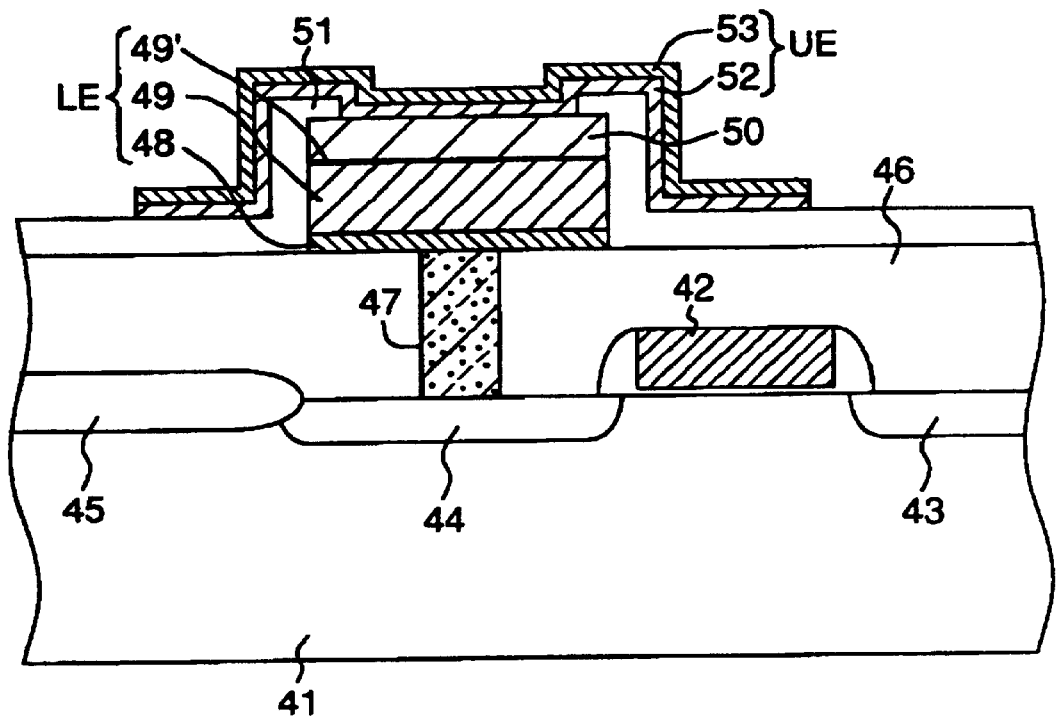
FIG. 4 is a sectional view showing a second embodiment of the semiconductor storage device of the present invention.

FIG. 4 is a sectional view showing the semiconductor storage device of the second embodiment.

A silicon substrate 41, a gate electrode 42, a source region 43, a drain region 44, a LOCOS oxide film 45, an interlaminar insulation film 46, a polysilicon plug 47, a ferroelectric thin film 50, and an interlaminar insulation film 51 of the semiconductor storage device of the second embodiment have the same construction as that of the silicon substrate 21, the gate electrode 22, the source region 23, the drain region 24, the LOCOS oxide film 25, the interlaminar insulation film 26, the polysilicon plug 27, the ferroelectric thin film 31, and the interlaminar insulation film 32 of the semiconductor storage device of the first embodiment, respectively.

The semiconductor storage device having the above construction is formed by the following procedure.

That is, in a procedure similar to that of the first embodiment, the LOCOS oxide film 45, the source region 43, the drain region 44, the gate electrode 42, the interlaminar insulation film 46, and the polysilicon plug 47 are sequentially formed on the P-type silicon substrate 41.

Then, as a lower-layer electrode 48, a PtRhOx film having a thickness of 100 Å–500 Å (preferably, 200 Å) is formed on the polysilicon plug 47 at a temperature of 250° C. by means of the DC magnetron reaction sputtering method. Then as an upper-layer lower electrode 49, a PtRh film having a thickness of 200 Å–1000 Å (preferably, 800 Å) is formed on the lower-layer lower electrode 48 at a temperature of 250° C. by means of the DC magnetron sputtering method. The two lower electrodes 48 and 49 are successively formed by changing the flow ratio of argon to oxygen.

If the lower-layer lower electrode 48 is formed of the PtRhOx film in a thickness of less than 100 Å, an oxygen gas atmosphere used in a later process of forming the ferroelectric thin film 50 diffuses to the polysilicon plug 27, thus oxidizing the polysilicon and preventing a good contact between the CMOS section and the capacitor section. If the lower-layer lower electrode 48 is formed of the PtRhOx film in a thickness of more than 500 Å, the total thickness of the capacitor section increases, which is unpreferable. The percentage of an oxygen content to all the elements in the PtRhOx film is set to 2%–30% for the reason described above with respect to the first embodiment.

If the upper-layer lower electrode 49 is formed of the PtRh film in a thickness of less than 200 Å, the leakage current characteristic value of the ferroelectric thin film 50 becomes greater by about one figure. If the lower electrode 49 is formed of the PtRh film in a thickness of more than 1000 Å, the entire thickness of the capacitor section increases, which is unpreferable.

Then, the lower electrodes 48 and 49 are annealed in an oxygen atmosphere at 550° C. for 10 minutes. As a result, the surface of the PtRh film composing the upper-layer lower electrode 49 is oxidized to form a layer 49' of PtRhOx. In this manner, the lower electrode LE consisting of the PtRhOx film, the PtRh film, and the PtRhOx film is formed, similarly to the first embodiment.

If the lower electrodes 48 and 49 are annealed at a temperature of lower than 400° C., the lower electrode 49' consisting of the PtRhOx is not formed on the surface of the upper-layer lower electrode 49. If the lower electrodes 48 and 49 are annealed at a temperature of higher than 700° C., the PtRhOx formed on the surface of the upper-layer lower electrode 49 is reduced, or oxidized. Thus, it is impossible to obtain effects similar to those of the first embodiment.

Then, in a procedure similar to that of the first embodiment, the ferroelectric thin film 50 is formed and annealed. Then, the interlaminar insulation film 51 is formed and a contact hole is formed through the interlaminar insulation film 51 such that the contact hole leads to the ferroelectric thin film 50.

Then, as a lower-layer upper electrode 52, a PtRh film having a thickness of 200 Å–1000 Å (preferably, 800 Å) is formed in an upper position of the capacitor section at 250° C. by means of the DC magnetron sputtering method. As an upper-layer upper electrode 53, a PtRhOx film having a thickness of 100 Å–500 Å (preferably, 200 Å) is formed on the lower-layer upper electrode 52 at 250° C. by means of the DC magnetron reactive sputtering method.

Then, the upper electrodes 52 and 53 are processed by the dry etching method. Finally, a lead electrode of the source region 43 of the CMOS section is formed.

A voltage pulse was applied between the lead electrode of the source region 43 and the upper electrode 52 and 53 of the capacitor section of the semiconductor storage device formed by the above method to determine the ferroelectric characteristics. As a result, a hysteresis loop was obtained which has ferroelectric characteristic values of Pr (the residual polarization value)=10 $\mu C/cm^2$ and Ec (coercive electric field)=35 kV/cm enough to be used as the ferroelectric capacitor and which has a good symmetry. This proves that the polysilicon plug 47 and the lower electrodes 48 and 49 contact each other closely.

The fatigue characteristic caused by polarization inversion was measured by application of a stress pulse having a frequency of 100 kHz, a duty ratio of 5%, and a voltage of 5 V. The result was that a residual polarization value Pr was kept at 91% of an initial value even after $10^{11}$ cycles. This indicates that the semiconductor storage device has a fatigue characteristic value much higher than the conventional semiconductor storage device.

The optimum total thickness of the lower electrodes 48, 49, and 49' is 1000 Å. This value is smaller than the optimum thickness of 1300 Å of the lower electrodes 28, 29, and 30 of the first embodiment. Thus, the difference in level of the capacitor section is allowed to be even smaller, and hence the errors occurring in photolithographic process are allowed to be further reduced.

According to the second embodiment, the leakage current characteristic value of the ferroelectric thin film 50 is improved by one figure.

As described above, because the lower electrode LE is formed by depositing only two layers of the PtRhOx film and the PtRh film in the second embodiment, the film-forming process of the lower electrode is simplified and yet effects similar to those of the first embodiment can be obtained.

The lower electrode LE consisting of the PtRhOx film and the PtRh film only can be obtained by omitting the annealing in an oxygen atmosphere after those films are formed. Then, similarly to the first and second embodiments, a ferroelectric thin film, an interlaminar insulation film, a lower-layer upper electrode, and an upper-layer upper electrode are formed. In this manner, a semiconductor storage device having effects similar to those of the first and second embodiments is obtained.

Third Embodiment

In the first embodiment, the lower electrode LE of the capacitor section is formed of the three layers consisting of the PtRhOx film, the PtRh film, and the PtRhOx film, whereas the lower electrode LE of the third embodiment is formed of one layer consisting of the PtRhOx film.

Figure 5:
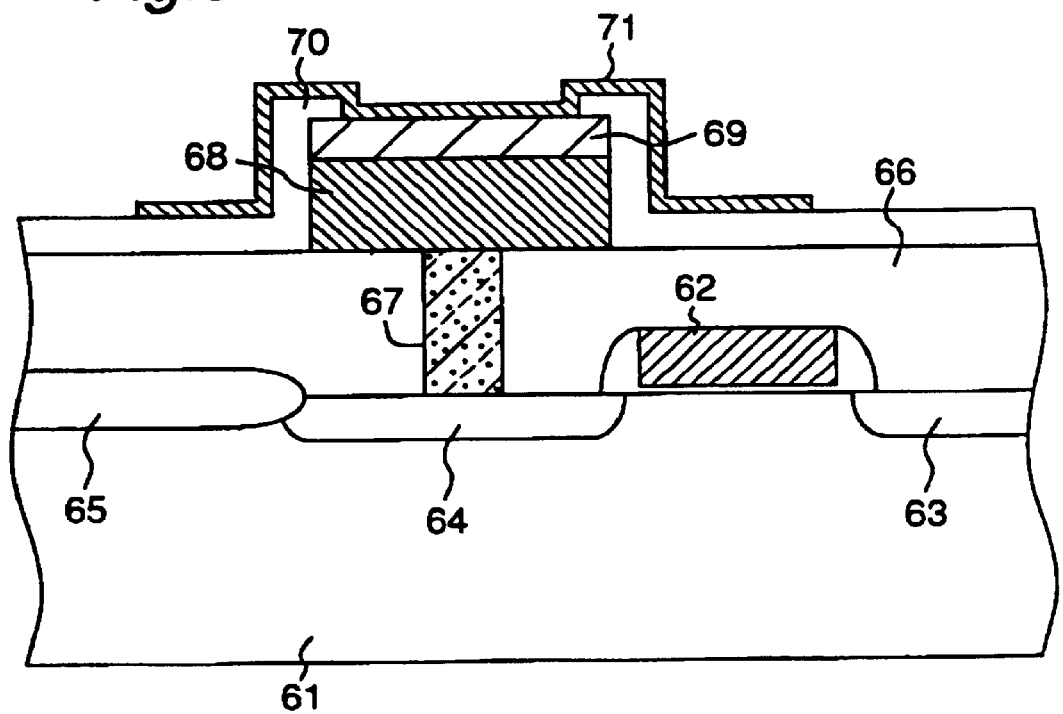
FIG. 5 is a sectional view showing a third embodiment of the semiconductor storage device of the present invention.

FIG. 5 is a sectional view showing a semiconductor storage device of the third embodiment.

A silicon substrate 61, a gate electrode 62, a source region 63, a drain region 64, a LOCOS oxide film 65, an interlaminar insulation film 66, a polysilicon plug 67, a ferroelectric thin film 69, and an interlaminar insulation film 70 of the semiconductor storage device of the third embodiment have the same construction as that of the silicon substrate 21, the gate electrode 22, the source region 23, the drain region 24, the LOCOS oxide film 25, the interlaminar insulation film 26, the polysilicon plug 27, the ferroelectric thin film 31, and the interlaminar insulation film 32 of the semiconductor storage device of the first embodiment shown in FIG. 1, respectively.

A lower electrode 68 consisting of the PtRhOx film is formed on the polysilicon plug 67 formed in the interlaminar insulation film 66. An upper electrode 71 consisting of the PtRhOx film is formed in an upper position of the capacitor section.

The semiconductor storage device having the above construction is formed by the following procedure.

That is, in a procedure similar to that of the first embodiment, the LOCOS oxide film 65, the source region 63, the drain region 64, the gate electrode 62, the interlaminar insulation film 66, and the polysilicon plug 67 are sequentially formed on the P-type silicon substrate 61.

Then, as the lower electrode 68, a PtRhOx film having a thickness of 500 Å–2000 Å (preferably, 1000 Å) is formed directly on the polysilicon plug 67 at 250° C. by means of the DC magnetron reactive sputtering method.

If the lower electrode 68 is formed of the PtRhOx film in a thickness of less than 500 Å, an oxygen gas atmosphere used in a subsequent process of forming the ferroelectric thin film 69 by the sol-gel method permeates into the polysilicon plug 67, thus oxidizing the polysilicon and preventing a preferable contact from being accomplished between the CMOS section and the capacitor section. If the lower electrode 68 is formed of the PtRhOx film in a thickness of more than 2000 Å, the total thickness of the capacitor section unpreferably increases. The percentage of an oxygen content to all the elements of the PtRhOx film is set to 2%–30%, similarly to the first embodiment.

Then, in a procedure similar to that of the first embodiment, the ferroelectric thin film 69 is formed and annealed. Then, the interlaminar insulation film 70 is formed, and a contact hole leading to the ferroelectric thin film 69 is formed in the interlaminar insulation film 70.

Then, a PtRhOx film having a thickness of 500 Å–2000 Å (preferably, 1000 Å) is formed as the upper electrode 71 in an upper position of the capacitor section at 250° C. by means of the DC magnetron reactive sputtering method.

Then, the upper electrode 71 is processed by the dry etching method. Finally, a lead electrode of the source region 63 of the CMOS section is formed.

The ferroelectric characteristic of the semiconductor storage device formed as described above was determined by a method similar to that of the first and second embodiments. As a result, a symmetric hysteresis loop having values of Pr=13 $\mu$C/cm$^2$ and Ec=45 kV/cm was obtained. This proves that the polysilicon plug 67 and the lower electrode 68 contact each other closely.

Fatigue characteristic cause by polarization inversion was measured through the application of a stress pulse having a frequency of 100 kHz, a duty ratio of 5%, and a voltage of 5 V. The result was that the residual polarization value Pr was 97% of an initial value even after $10^{11}$ cycles. This indicates that the semiconductor storage device of this embodiment has a considerably good fatigue characteristic.

The optimum thickness of the lower electrode 68 is 1000 Å, which value is smaller than that of the first embodiment. Thus, the difference in level of the capacitor section is allowed to be smaller than that of the first embodiment, and hence possible errors in the photolithographic process are allowed to be reduced.

According to the third embodiment, only the PtRhOx film is formed as the lower electrode. Thus, the lower electrode can be formed in a further simplified process.

Fourth Embodiment

In the first embodiment, the lower electrode LE of the capacitor section is formed of the lowermost layer of the PtRhOx film, the intermediate layer of the PtRh film, and the uppermost layer of the PtRhOx film, whereas the lower electrode LE of the fourth embodiment is formed of a lowermost layer of a PtRh film, an intermediate layer of a PtRhOx film, and an uppermost layer of a PtRh film formed sequentially from a polysilicon plug side.

FIG. 6 is a sectional view showing a semiconductor storage device of the fourth embodiment.

A silicon substrate 81, a gate electrode 82, a source region 83, a drain region 84, a LOCOS oxide film 85, an interlaminar insulation film 86, a polysilicon plug 87, a ferroelectric thin film 91, and an interlaminar insulation film 92 of the semiconductor storage device of the fourth embodiment have the same construction as that of the silicon substrate 21, the gate electrode 22, the source region 23, the drain region 24, the LOCOS oxide film 25, the interlaminar insulation film 26, the polysilicon plug 27, the ferroelectric thin film 31, and the interlaminar insulation film 32 of the semiconductor storage device of the first shown in the FIG. 1 embodiment, respectively.

A lowermost-layer lower electrode 88 consisting of the PtRh film, an intermediate-layer lower electrode 89 consisting of the PtRhOx film, and an uppermost-layer lower electrode 90 consisting of the PtRh film are sequentially laminated on the interlaminar insulation film 86 and in the position of polysilicon plug 87. Further, a lowermost-layer upper electrode 93 consisting of a PtRh film, an intermediate-layer upper electrode 94 consisting of a PtRhOx film, and an uppermost-layer upper electrode 95 consisting of a PtRh film are sequentially laminated in an upper position of the capacitor section.

The semiconductor storage device having the above construction is formed by the following procedure.

That is, in a procedure similar to that of the first embodiment, the LOCOS oxide film 85, the source region 83, the drain 84, the gate electrode 82, the interlaminar insulation film 86, and the polysilicon plug 87 are sequentially formed on the P-type silicon substrate 81.

Then, as the lowermost-layer lower electrode 88, a PtRh film having a thickness of 100 Å–1000 Å (preferably, 200 Å) is formed on the polysilicon plug 87 at 250° C. by means of the DC magnetron sputtering method. As the intermediate-layer lower electrode 89, a PtRhOx film having a thickness of 100 Å–800 Å (preferably, 800 Å) is formed on the lowermost-layer lower electrode 88 at 250° C. by means of the DC magnetron reactive sputtering method. As the uppermost-layer lower electrode 90, a PtRh film having a thickness of 200 Å–500 Å (preferably, 300 Å) is formed on the intermediate-layer lower electrode 89 at 250° C. by means of the DC magnetron sputtering method.

The three lower electrode 88, 89, and 90 are successively formed by changing the flow ratio of argon to oxygen.

In the fourth embodiment, because the lowermost-layer lower electrode 88 consisting of the PtRh metal film is formed directly on the polysilicon plug 87, the lowermost-layer lower electrode 88 contacts the polysilicon plug 87 very closely. Thus it is possible to block permeation of oxygen into the polysilicon plug 87 from the intermediate-layer lower electrode 89 consisting of the PtRhOx film in a later process of heat-treating the ferroelectric thin film 91. Thus, the surface of the polysilicon plug 87 is prevented from being oxidized.

If the lowermost-layer lower electrode 88 is formed of the PtRh film in a thickness of less than 100 Å, the lowermost-layer lower electrode 88 is incapable of contacting the polysilicon plug 87 very closely. If the lowermost-layer lower electrode 88 is formed of the PtRh film in a thickness of more than 1000 Å, the total thickness of the capacitor section unpreferably increases.

If the intermediate-layer lower electrode 89 is formed of the film in a thickness of less than 100 Å, it is impossible to prevent an oxygen gas atmosphere from permeating through the films to the polysilicon plug 87 in forming the ferroelectric thin film 91. If the intermediate-layer layer lower electrode 89 is formed of the PtRhOx film in a thickness of more than 800 Å, the total thickness of the capacitor section increases, which is unpreferable.

If the uppermost-layer lower electrode 90 is formed of the PtRh film in a thickness of less than 200 Å, the leakage current characteristic of the ferroelectric thin film 91 deteriorates. If the thickness of the uppermost-layer lower electrode 90 is more than 500 Å, the total thickness of the capacitor section is unpreferably great.

Then, in a procedure similar to that of the first embodiment, the ferroelectric thin film 91 is formed and annealed. Then, the interlaminar insulation film 92 is formed, and a contact hole is formed through the interlaminar insulation film 92 such that the contact hole leads to the ferroelectric thin film 91.

Then, as the lowermost-layer upper electrode 93, a PtRh film having a thickness of 200 Å–500 Å (preferably, 300 Å) is formed in an upper position of the capacitor section at 250° C. by means of the DC magnetron sputtering method. As the intermediate-layer upper electrode 94, a PtRhOx film having a thickness of 100 Å–800 Å (preferably, 800 Å) is formed on the lowermost-layer upper electrode 93 at 250° C. by means of the DC magnetron reactive sputtering method. As the uppermost-layer upper electrode 95, a PtRh film having a thickness of 100 Å–1000 Å (preferably, 200 Å) is formed on the intermediate-layer upper electrode 94 at 250° C. by means of the DC magnetron sputtering method.

Then, the upper electrodes 93, 94, and 95 are processed by the dry etching method. Finally, a lead electrode of the source region 83 of the CMOS section is formed.

The ferroelectric characteristics of the semiconductor storage device formed in the above method were determined in the manner as previously described. As a result a symmetric hysteresis loop having values of Pr=10 $\mu$C/cm$^2$ and Ec=35 kV/cm was obtained. This proves that the polysilicon plug 87 and the lower electrodes 88, 89, and 90 contact each other closely.

Fatigue characteristics caused by polarization inversion were measured through application of a stress pulse having a frequency of 100 kHz, a duty ratio of 5%, and a voltage of 5 V. The result was that the residual polarization value Pr was 91% of an initial value even after $10^{11}$ cycles. This indicates that the semiconductor storage device has a considerably good fatigue characteristic.

The optimum sum of the thicknesses of the lower electrodes 88, 89, and 90 is 1300 Å. Thus, the difference in level of the capacitor section is allowed to be smaller than in the conventional semiconductor storage device wherein a barrier metal is interposed between the polysilicon plug and the lower electrode. Hence errors in accuracy in the photolithographic process are reduced.

As described above, because the lower electrode LE formed directly on the polysilicon plug 87 consists of the three layers of the PtRh film, the PtRhOx film, and the PtRh film, the PtRhOx film blocks out the oxygen gas atmosphere which tends to permeate into the polysilicon plug 87. Therefore, the surface of the polysilicon plug 87 is prevented from being oriented and a good contact is accomplished between the CMOS section and the capacitor section.

Consequently, unlike the conventional semiconductor storage device, the semiconductor storage device of the present invention does not require a barrier metal made of TiN, which reduces the difference in level of the capacitor section.

Because the lowermost-layer lower electrode 88 consisting of the PtRh metal film is formed directly on the polysilicon plug 87, the lowermost-layer lower electrode 88 contacts the polysilicon plug 87 very closely. Thus it is possible to block permeation of oxygen through the lowermost-lower electrode to the polysilicon plug 87 from the intermediate-layer lower electrode 89 consisting of the PtRhOx film in heat-treating the ferroelectric thin film 91. Therefore, the capacitor section and the CMOS section contact each other very closely.

Fifth Embodiment

In the fourth embodiment, the lower electrode LE of the capacitor section is formed of the lowermost layer consisting of the PtRh film, the intermediate layer consisting of the PtRhOx film, and the uppermost layer consisting of the PtRh film, whereas in the fifth embodiment, the lower electrode LE is formed of two layers, namely, a lower layer consisting of a PtRh film and an upper layer consisting of a PtRhOx film.

FIG. 7 is a sectional view showing a semiconductor storage device of the fifth embodiment.

A silicon substrate 101, a gate electrode 102, a source region 103, a drain region 104, a LOCOS oxide film 105, an interlaminar insulation film 106, a polysilicon plug 107, a ferroelectric thin film 110, and an interlaminar insulation film 111 of the semiconductor storage device of the fifth embodiment have the same construction as that of the silicon substrate 21, the gate electrode 22, the source region 23, the drain region 24, the LOCOS oxide film 25, the interlaminar insulation film 26, the polysilicon plug 27, the ferroelectric thin film 31, and the interlaminar insulation film 32 of the semiconductor storage device of the first embodiment, respectively.

A lower-layer lower electrode 108 consisting of the PtRh film is positioned on the polysilicon plug 107 formed in the interlaminar insulation film 106, and an upper-layer lower electrode 109 consisting of the PtRhOx film is laminated over the lower-layer lower electrode 108. Also, a lower-layer upper electrode 112 consisting of the PtRhOx film and an upper-layer upper electrode 113 consisting of the PtRh film are sequentially formed in an upper position of the capacitor section.

The semiconductor storage device having the above construction is formed by the following procedure.

That is, in a procedure similar to that of the first embodiment, the LOCOS oxide film 105, the source region 103, the drain region 104, the gate electrode 102, the interlaminar insulation film 106, and the polysilicon plug 107 are sequentially formed on the P-type silicon substrate 101.

Then, as the lower-layer lower electrode 108, a PtRh film having a thickness of 100 Å–1000 Å (preferably, 200 Å) is formed immediately on the polysilicon plug 107 at 250° C. by means of the DC magnetron sputtering method. As the upper-layer lower electrode 109, a PtRhOx film having a thickness of 100 Å–800 Å (preferably, 800 Å) is formed on the lower lower electrode 108 at 250° C. by means of the DC magnetron reactive sputtering method.

The two lower electrodes 108 and 109 are successively formed by changing the flow ratio of argon to oxygen. For the same reason as described with respect to the fourth embodiment, the thicknesses of the PtRh film and the PtRhOx film are specified in the above ranges, respectively.

Similarly to the fourth embodiment, because the PtRh metal film is formed directly on the polysilicon plug 107, it is possible to block the permeation of oxygen gas to the polysilicon plug 107 from the PtRhOx film in a process of heat-treating the ferroelectric thin film 110.

Then, in a procedure similar to that of the first embodiment, the ferroelectric thin film 110 is formed and annealed. Then, the interlaminar insulation film 111 is formed, and a contact hole is formed through the interlaminar insulation film 111 such that the contact hole leads to the ferroelectric thin film 110.

Then, as the lower-layer upper electrode 112, a PtRhOx film having a thickness of 100 Å–800 Å (preferably, 800 Å) is formed in an upper position of the capacitor section at 250° C. by means of the DC magnetron reactive sputtering method. Then, as the upper-layer upper electrode 113, a PtRhOx film having a thickness of 100 Å–1000 Å (preferably, 200 Å) is formed on the lower-layer upper electrode 112 at 250° C. by means of the DC magnetron sputtering method.

Then, the upper electrodes 112 and 113 are processed by the dry etching method. Finally, a lead electrode of the source region 103 of the CMOS section is formed.

The ferroelectric characteristic of the thus formed semiconductor storage device was determined by the method as described previously. As a result, a symmetric hysteresis loop having values of Pr=13 $\mu$C/cm$^2$ and Ec=40 kV/cm was obtained. This proves that the polysilicon plug 107 and the lower electrodes 108 and 109 contact each other closely.

Fatigue characteristic caused by polarization inversion was measured by application of a stress pulse having a frequency of 100 kHz, a duty ratio of 5%, and a voltage of 5 V. The result was that the residual polarization value Pr was 97% of an initial value even after $10^{11}$ cycles. This indicates that the semiconductor storage device of the present embodiment has a very good fatigue characteristic.

The optimum sum of the thickness of the lower electrode 108 and that of the lower electrode 109 is 1000 Å. Thus, the difference in level of the capacitor section is allowed to be smaller than that of the conventional capacitor section wherein a barrier metal is interposed between the polysilicon plug and the lower electrode. Hence the error in the photolithographic process is reduced.

As described above, because in the fifth embodiment the lower electrode LE is formed of the layer of the PtRh film and the layer of the PtRhOx film, the film-forming process of the lower electrode can be simplified.

Sixth Embodiment

The lower electrode LE consisting of the two layers of the PtRhOx film and the PtRh film of the fifth embodiment can be formed by the method of the sixth embodiment as well.

Figure 8:
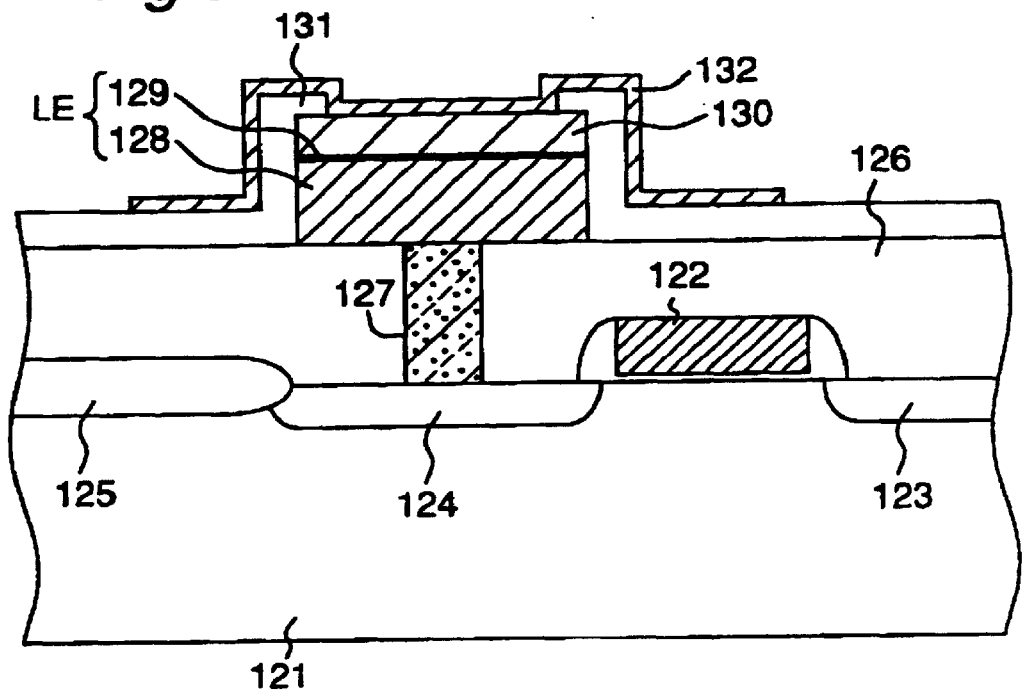
FIG. 8 is a sectional view showing a sixth embodiment of the semiconductor storage device of the present invention.

FIG. 8 is a sectional view showing the semiconductor storage device of the sixth embodiment.

A silicon substrate 121, a gate electrode 122, a source region 123, a drain region 124, a LOCOS oxide film 125, an interlaminar insulation film 126, a polysilicon plug 127, a ferroelectric thin film 130, and an interlaminar insulation film 131 of the semiconductor storage device of the sixth embodiment have the same construction as that of the silicon substrate 21, the gate electrode 22, the source region 23, the drain region 24, the LOCOS oxide film 25, the interlaminar insulation film 26, the polysilicon plug 27, the ferroelectric thin film 31, and the interlaminar insulation film 32 of the semiconductor storage device of the first embodiment, respectively.

The semiconductor storage device having the construction is formed by the following procedure.

That is, in a procedure similar to that of the first embodiment, the LOCOS oxide film 125, the source region 123, the drain region 124, the gate electrode 122, the interlaminar insulation film 126, and the polysilicon plug 127 are sequentially formed over the P-type silicon substrate 121.

Then, as a lower electrode 128, a PtRh film having a thickness of 500 Å–2000 Å (preferably, 1000 Å) is formed directly on the polysilicon plug 127 at 250° C. by means of the DC magnetron sputtering method.

Thereafter, the lower electrode 128 is annealed in an oxygen atmosphere at 550° C. for 10 minutes. As a result, the surface of the PtRh film forming the lower electrode 128 is oxidized to form a PtRhOx film 129. It is preferable to anneal the lower electrode 128 at a temperature in a range of 400° C.–700° C. for the same reason as described with respect to the second embodiment. If the thickness of the PtRh film forming the lower electrode 128 is less than 500 Å, an optimum layer consisting of the PtRhOx film is not formed. In addition, the lower electrode 128 obtained is incapable of contacting the polysilicon plug 127 very closely, and a good leakage current characteristic of the ferroelectric thin film 130 cannot be obtained. If the thickness of the PtRh film forming the lower electrode 128 is more than 2000 Å, the total thickness of the capacitor section becomes too great, which is also unpreferable.

If the lower electrode 128 to be positioned directly on the polysilicon plug 127 is formed of Pt only, polysilicon and Pt react with each other to form a silicide after the heat treatment of the ferroelectric thin film 130. Then, the surface of the silicide is oxidized by the oxygen gas atmosphere which has permeated through the lower electrode 128 to form a silicon oxide on the surface of the Pt. Consequently, the polysilicon plug 127 and the lower electrode do not contact each other closely.

On the other hand, if the lower electrode 128 is formed of a PtRh film as in the sixth embodiment, a PtRhOx layer 129 is formed on the surface of the lower electrode 128 by annealing it in an oxygen atmosphere. Consequently, oxygen gas is prevented from permeating into the polysilicon plug 127 in forming the ferroelectric thin film 130. Accordingly, the polysilicon is prevented from being oxidized, which allows a close contact to be achieved between the lower electrode 128 and the polysilicon plug 127.

Then, in a procedure similar to that of the first embodiment, the ferroelectric thin film 130 is formed and annealed. Then, the interlaminar insulation film 131 is formed, and a contact hole leading to the ferroelectric thin film 130 is formed through the interlaminar insulation film 131.

Then, as an upper electrode 132, a PtRh film having a thickness of 500 Å–2000 Å (preferably, 1000 Å) is formed in an upper position of the capacitor section at 250° C. by means of the DC magnetron sputtering method.

Then, the upper electrode 132 is processed by the dry etching method. Finally, a lead electrode of the source region 123 of the CMOS section is formed.

The ferroelectric characteristic of the semiconductor storage device formed as described above was determined by the method previously described. As a result, a symmetric hysteresis loop having values of Pr=10 $\mu$C/cm$^2$ and Ec=35 kV/cm is obtained. This proves that the polysilicon plug 127 and the lower electrodes 128 and 129 contact each other closely.

Also, a fatigue characteristic caused by polarization inversion was measured through application of a stress pulse having a frequency of 100 kHz, a duty ratio of 5%, and a voltage of 5 V. The result was that the residual polarization value Pr was 91% of an initial value even after $10^{11}$ cycles. This indicates that the semiconductor storage device of the present embodiment also has a considerably good fatigue characteristic.

The optimum sum of the thickness of the lower electrode 128 and that of the lower electrode 129 is 1000 Å. Thus, the difference in level of the capacitor section is allowed to be smaller than that of the conventional capacitor section in which a barrier metal is interposed between the polysilicon plug and the lower electrode. Hence the error occurring in a photolithographic process is reduced.

Seventh Embodiment

In the above fourth embodiment, the lower electrode LE of the capacitor section is formed of the PtRh film of the lowermost layer, the PtRhOx film of the intermediate layer, and the PtRh film of the uppermost layer, whereas in the seventh embodiment, the lower electrode LE of the capacitor section is formed of the Pt film of the lowermost layer, the PtRhOx film of the intermediate layer, and the Pt film of the uppermost layer.

Figure 9:
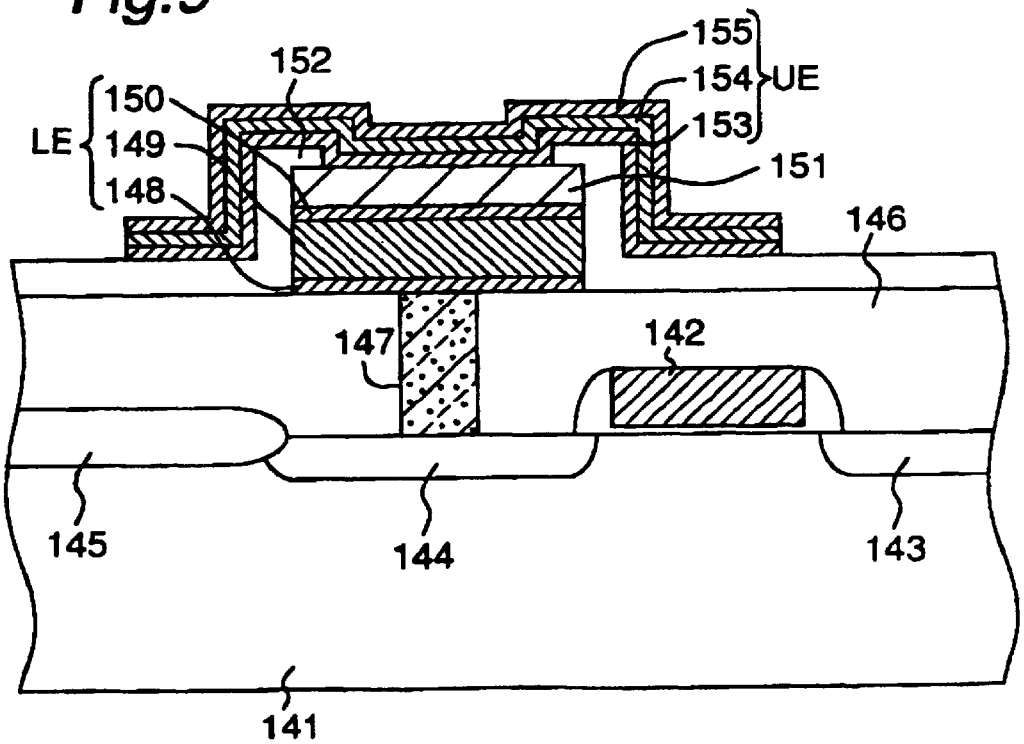
FIG. 9 is a sectional view showing a seventh embodiment of the semiconductor storage device of the present invention.

FIG. 9 is a sectional view showing a semiconductor storage device of the seventh embodiment.

A silicon substrate 141, a gate electrode 142, a source region 143, a drain region 144, a LOCOS oxide film 145, an interlaminar insulation film 146, a polysilicon plug 147, a ferroelectric thin film 151, and an interlaminar insulation film 152 of the semiconductor storage device of the seventh embodiment have the same construction as that of the silicon substrate 21, the gate electrode 22, the source region 23, the drain region 24, the LOCOS oxide film 25, the interlaminar insulation film 26, the polysilicon plug 27, the ferroelectric thin film 31, and the interlaminar insulation film 32 of the semiconductor storage device shown in FIG. 1.

A lowermost-layer lower electrode 148 consisting of a Pt film, an intermediate-layer lower electrode 149 consisting of a PtRhOx film, and an uppermost-layer lower electrode 150 consisting of a Pt film are sequentially laminated on the interlaminar insulation film 146 and in the position of the polysilicon plug 147. Further, a lowermost-layer upper electrode 153 consisting of the Pt film, an intermediate-layer upper electrode 154 consisting of the PtRhOx film, and an uppermost-layer upper electrode 155 consisting of the Pt film are sequentially laminated on the capacitor section.

The semiconductor storage device having the construction is formed by the following procedure.

That is, in a procedure similar to that of the first embodiment, the LOCOS oxide film 145, the source region 143, the drain 144, the gate electrode 142, the interlaminar insulation film 146, and the polysilicon plug 147 are sequentially formed on the P-type silicon substrate 141.

Then, as the lowermost-layer lower electrode 148, a Pt film having a thickness of 100 Å–1000 Å (preferably, 200 Å) is formed on the polysilicon plug 147 at 250° C. by means of DC magnetron sputtering method. As the intermediate-layer lower electrode 149, a PtRhOx film having a thickness of 100 Å–800 Å (preferably, 800 Å) is formed on the lowermost-layer lower electrode 148 at 250° C. by means of the DC magnetron reactive sputtering method. As the uppermost-layer lower electrode 150, a Pt film having a thickness of 200 Å–500 Å (preferably, 300 Å) is formed on the intermediate-layer lower electrode 149 at 250° C. by means of the DC magnetron sputtering method.

Because the lowermost-layer lower electrode 148 positioned directly on the polysilicon plug 147 consists of the Pt metal film in the seventh embodiment, the lowermost-layer lower electrode 148 contacts the polysilicon plug 147 very closely. Further, because the PtRhOx film is formed on the lowermost-layer lower electrode 148, it is possible to block the diffusion of oxygen gas to the polysilicon plug 147 in a process of heat-treating the ferroelectric thin film 151. Thus, the surface of the polysilicon plug 147 is prevented from being oxidized, and a good contact is achieved between the polysilicon plug 147 and the lower electrodes 148, 149, and 150.

If the Pt film forming the lowermost-layer lower electrode 148 has a thickness of less than 100 Å, the lowermost-layer lower electrode 148 is incapable of contacting the polysilicon plug 147 very closely. On the other hand, if the Pt film has a thickness of more than 1000 Å, the total thickness of the capacitor section becomes unpreferably great.

If the thickness of the PtRhOx film forming the intermediate-layer lower electrode 149 is less than 100 Å, it is impossible to prevent an oxygen atmosphere from permeating into the polysilicon plug 147 in forming the ferroelectric thin film 151. If the thickness of the PtRhOx is more than 800 Å, the capacitor section is unpreferably thickened.

Further, if the Pt film forming the uppermost-layer lower electrode 150 has a thickness of less than 200 Å, the leakage current characteristic of the ferroelectric thin film 151 deteriorates. If the thickness of this Pt film is more than 500 Å, the capacitor section is unpreferably thickened.

Then, in a procedure similar to that of the first embodiment, the ferroelectric thin film 151 is formed and annealed. Then, the interlaminar insulation film 152 is formed and a contact hole is formed through the interlaminar insulation film 152 such that the contact hole leads to the ferroelectric thin film 151.

Then, as the uppermost-layer upper electrode 153, a Pt film having a thickness of 200 Å–500 Å (preferably, 300 Å) is formed in an upper position of the capacitor section at 250° C. by means of the DC magnetron sputtering method. Then, as the intermediate-layer upper electrode 154, a PtRhOx film having a thickness of 100 Å–800 Å (preferably, 800 Å) is formed on the uppermost-layer upper electrode 153 at 250° C. by means of the DC magnetron reactive sputtering method. Then, as the uppermost-layer upper electrode 155, a Pt film having a thickness of 100 Å–1000 Å (preferably, 200 Å) is formed on the intermediate-layer upper electrode 154 at 250° C. by means of the DC magnetron sputtering method.

Then, the upper electrodes 153, 154, and 155 are processed by the dry etching method. Finally, a lead electrode from the source region 143 of the CMOS section is formed.

The ferroelectric characteristic of the thus formed semiconductor storage device was determined in the manner as described before. As a result, a symmetric hysteresis loop of Pr=14 μC/cm$^2$ and Ec=35 kV/cm was obtained. This proves that the polysilicon plug 147 and the lower electrodes 148, 149, and 150 contact each other closely.

Also, the fatigue characteristic caused by polarization inversion was measured by application of a stress pulse having a frequency of 100 kHz, a duty ratio of 5%, and a voltage of 5 V. The result was that the residual polarization value Pr was 88% of an initial value even after 10$^{11}$ cycles. This indicates that the semiconductor storage device has a very good fatigue characteristic.

The optimum thickness, namely the total sum of the lower electrodes 148, 149, and 150 is 1300 Å. Thus, the difference in level, or the surface unevenness, of the capacitor section is allowed to be smaller than in the conventional semiconductor device in which a barrier metal is formed between the polysilicon plug and the lower electrode. Hence the errors occurring in the photolithographic process are reduced.

As described above, because the lower electrode LE formed directly on the polysilicon plug 147 consists of the three layers, namely, the layer of the Pt film, that of the PtRhOx film, and that of the Pt film, the oxygen gas atmosphere which tends to permeate into the polysilicon plug 147 is blocked out by the PtRhOx film. Therefore, the surface of the polysilicon plug 147 is prevented from being oxidized, and a close contact is obtained between the CMOS section and the capacitor section.

Consequently, unlike the conventional semiconductor storage device, the semiconductor storage device of the seventh embodiment does not require a barrier metal made of TiN, which contributes to reduction of the unevenness of the capacitor section.

Because the lowermost-layer lower electrode 148 formed directly on the polysilicon plug 147 consists of the Pt metal film, the lowermost-layer lower electrode 148 contacts the polysilicon plug 147 very closely. Further, because the PtRhOx film is formed on the lowermost-layer lower electrode 148, oxygen is prevented from diffusing into the polysilicon plug 147 in heat-treating the ferroelectric thin film 151. Thus, an improved contact is obtained between the capacitor section and the CMOS section.

Eighth Embodiment

In the seventh embodiment, the lower electrode LE of the capacitor section is formed of the lowermost layer consisting of the Pt film, the intermediate layer consisting of the PtRhOx film, and the uppermost layer consisting of the Pt film, whereas in the eighth embodiment, the lower electrode LE is formed of a lower layer consisting of a Pt film and an upper layer consisting of a PtRhOx film.

Figure 10:
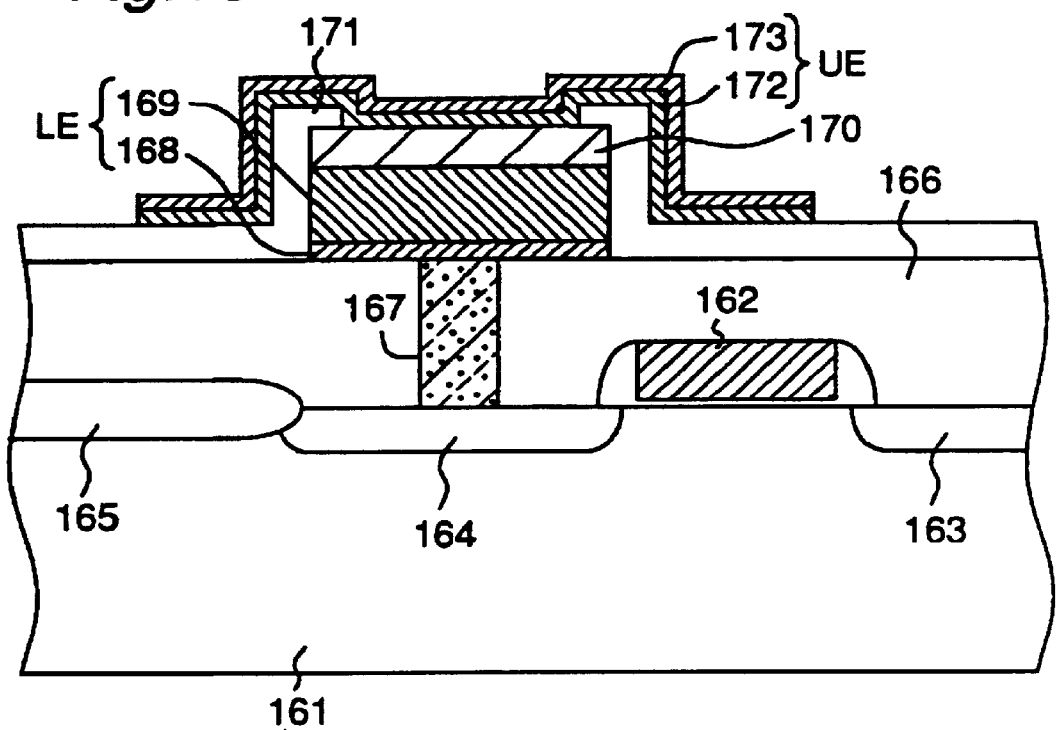
FIG. 10 is a sectional view showing an eighth embodiment of the semiconductor storage device of the present invention.

FIG. 10 is a sectional view showing a semiconductor storage device of the eighth embodiment.

A silicon substrate 161, a gate electrode 162, a source region 163, a drain region 164, a LOCOS oxide film 165, an interlaminar insulation film 166, a polysilicon plug 167, a ferroelectric thin film 170, and an interlaminar insulation film 171 of the semiconductor storage device of the eighth embodiment have the same construction as that of the silicon substrate 21, the gate electrode 22, the source region 23, the drain region 24, the LOCOS oxide film 25, the interlaminar insulation film 26, the polysilicon plug 27, the ferroelectric thin film 31, and the interlaminar insulation film 32 of the semiconductor storage device of the first embodiment shown in FIG. 1, respectively.

A lower-layer lower electrode 168 consisting of a Pt film and an upper-layer lower electrode 169 consisting of a PtRhOx film are sequentially laminated on the interlaminar insulation film 166 and in the position of the polysilicon plug 167. Further, a lower-layer upper electrode 172 consisting of a PtRhOx film and upper-layer upper electrode 173 consisting of a Pt film are sequentially laminated in an upper position of the capacitor section.

The semiconductor storage device having the above construction is formed by the following procedure.

That is, in a procedure similar to that of the first embodiment, the LOCOS oxide film 165, the source region 163, the drain region 164, the gate electrode 162, the interlaminar insulation film 166, and the polysilicon plug 167 are sequentially formed over the P-type silicon substrate 161.

Then, as a lower-layer lower electrode 168, a Pt film having a thickness of 100 Å–1000 Å (preferably, 200 Å) is formed directly on the polysilicon plug 167 at 250° C. by means of the DC magnetron sputtering method. Then, as an upper-layer lower electrode 169, a PtRhOx film having a thickness of 100 Å–800 Å (preferably, 800 Å) is formed on the lower-layer lower electrode 168 at 250° C. by means of the DC magnetron reactive sputtering method. For the same reason as described with respect to the seventh embodiment, the thicknesses of the Pt film and the PtRhOx film are specified in the above range.

In the eighth embodiment, because the Pt metal film 168 is formed directly on the polysilicon plug 167 similarly to the seventh embodiment, the polysilicon plug 167 and the lower electrode contact each other closely. Further, because the PtRhOx film is formed on the Pt film, an oxygen gas is prevented from diffusing in the polysilicon plug 167 in a process of heat-treating the ferroelectric thin film 170.

Then, in a procedure similar to that of the first embodiment, the ferroelectric thin film 170 is formed and annealed. Then, the interlaminar insulation film 171 is formed, and a contact hole leading to the ferroelectric thin film 170 is formed in the interlaminar insulation film 171.

Then, as a lower-layer upper electrode 172, a PtRhOx film having a thickness of 100 Å–800 Å (preferably, 800 Å) is formed in an upper position of the capacitor section at 250° C. by means of the DC magnetron reactive sputtering method. Subsequently, as an upper-layer upper electrode 173, a Pt film having a thickness of 100 Å–1000 Å (preferably, 200 Å) is formed on the lower-layer upper electrode 172 at 250° C. by means of the DC magnetron sputtering method.

Then, the upper electrodes 172 and 173 are processed by the dry etching method. Finally, a lead electrode of the source region 163 of the CMOS section is formed.

The ferroelectric characteristic of the thus formed semiconductor storage device was determined by the method described previously. As a result, a symmetric hysteresis loop having values of Pr=13 μC/cm$^2$ and Ec=41 kV/cm was obtained. This proves that the polysilicon plug 167 and the lower electrodes 168 and 169 contact each other closely.

Also, the fatigue characteristic caused by the polarization inversion was measured through appllication of a stress pulse having a frequency of 100 kHz, a duty ratio of 5%, and a voltage of 5 V. The result was that the residual polarization value Pr was 97% of an initial value even after $10^{11}$ cycles. This indicates that the semiconductor storage device of this embodiment has a considerably good fatigue characteristic.

The optimum total sum of the thickness of the lower electrode 168 and that of the lower electrode 169 is 1000 Å. Thus, the difference in level, or the unevenness, of the capacitor section is allowed to be smaller than that of the conventional semiconductor storage device in which a barrier metal is interposed between the polysilicon plug and the lower electrode. Hence, errors in the photolithographic process are reduced.

As described above, because in the eighth embodiment, the lower electrode LE is formed of the two layers, namely, the layer of the Pt film and that of the PtRhOx film, the film-forming process of the lower electrode can be simplified.

Ninth Embodiment

PZT, a ferroelectric substance, is used as a material of the capacitor in the first through eighth embodiments, whereas in the ninth embodiment, $(Ba_xSr_{1-x})TiO_3$ ($0 \leq x \leq 1$) which is a high dielectric substance is used as such a material.

Figure 11:
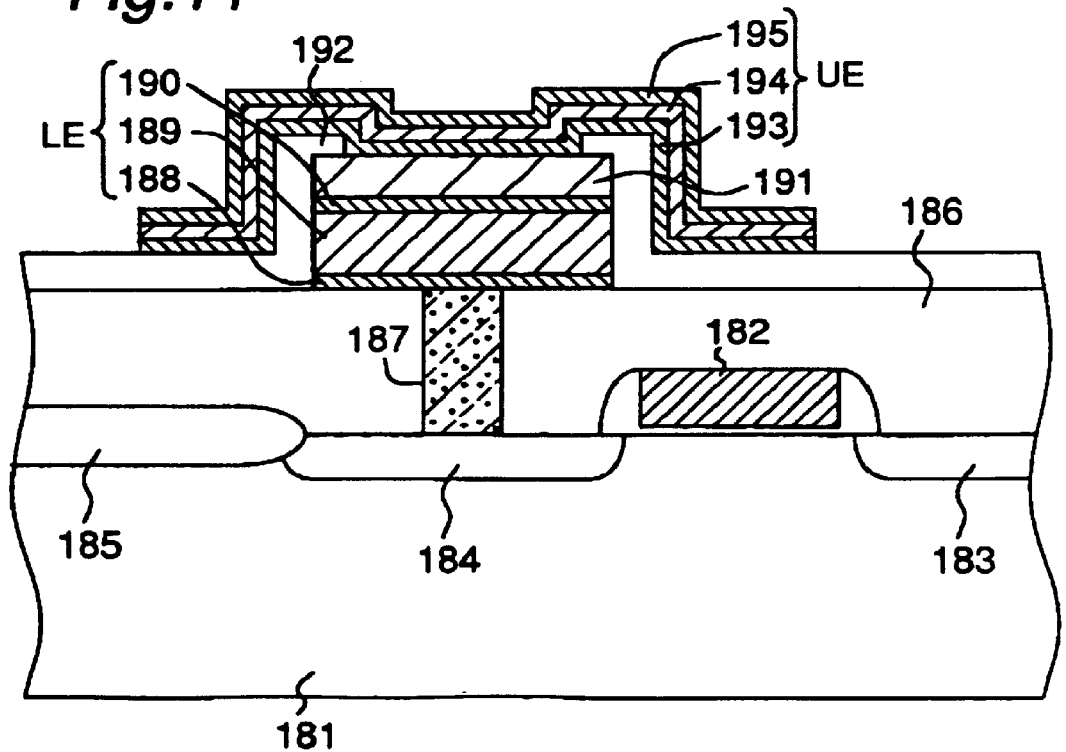
FIG. 11 is a sectional view showing a ninth embodiment of the semiconductor storage device of the present invention.

FIG. 11 is a sectional view showing a semiconductor storage device of the ninth embodiment.

A silicon substrate 181, a gate electrode 182, a source region 183, and a drain region 184, a LOCOS oxide film 185, an interlaminar insulation film 186, a polysilicon plug 187, lower electrodes 188–190, an interlaminar insulation film 192, and upper electrodes 193–195 have the same construction as that of the silicon substrate 21, the gate electrode 22, the source region 23, the drain region 24, the LOCOS oxide film 25, the interlaminar insulation film 26, the polysilicon plug 27, the lower electrodes 28–30, the interlaminar insulation film 32, and the upper electrodes 33–35 of the semiconductor storage device of the first embodiment shown in FIG. 1, respectively.

A high dielectric thin film 191 of $(Ba_xSr_{1-x})TiO_3$ is formed on the uppermost-layer lower electrode 190 to form the capacitor.

The semiconductor storage device having the above construction is formed by the following procedure.

That is, in a procedure similar to that of the first embodiment, the LOCOS oxide film 185, the source region 183, the drain region 184, the gate electrode 182, the interlaminar insulation film 186, the polysilicon plug 187, and the lower electrodes 188–190 are sequentially formed on the P-type silicon substrate 181.

Then, to form the high dielectric thin film 191, a film of $(Ba_xSr_{1-x})TiO_3$ is deposited in a thickness of 2000 Å on the uppermost-layer lower electrode 190 at a substrate temperature of 450° C. by means of a sputtering method using a sintered substance of $(Ba_xSr_{1-x})TiO_3$ as a target.

Then, in a procedure similar to that of the first embodiment, the interlaminar insulation film 192 is formed, and a contact hole is formed in the interlaminar insulation film 192 such that the contact hole leads to the high dielectric thin film 191. Then, the upper electrodes 193–195 are formed. Then, these upper electrodes 193–195 are processed by dry etching method. Finally, a lead electrode of the source region 183 of the CMOS section is formed.

Figure 12:
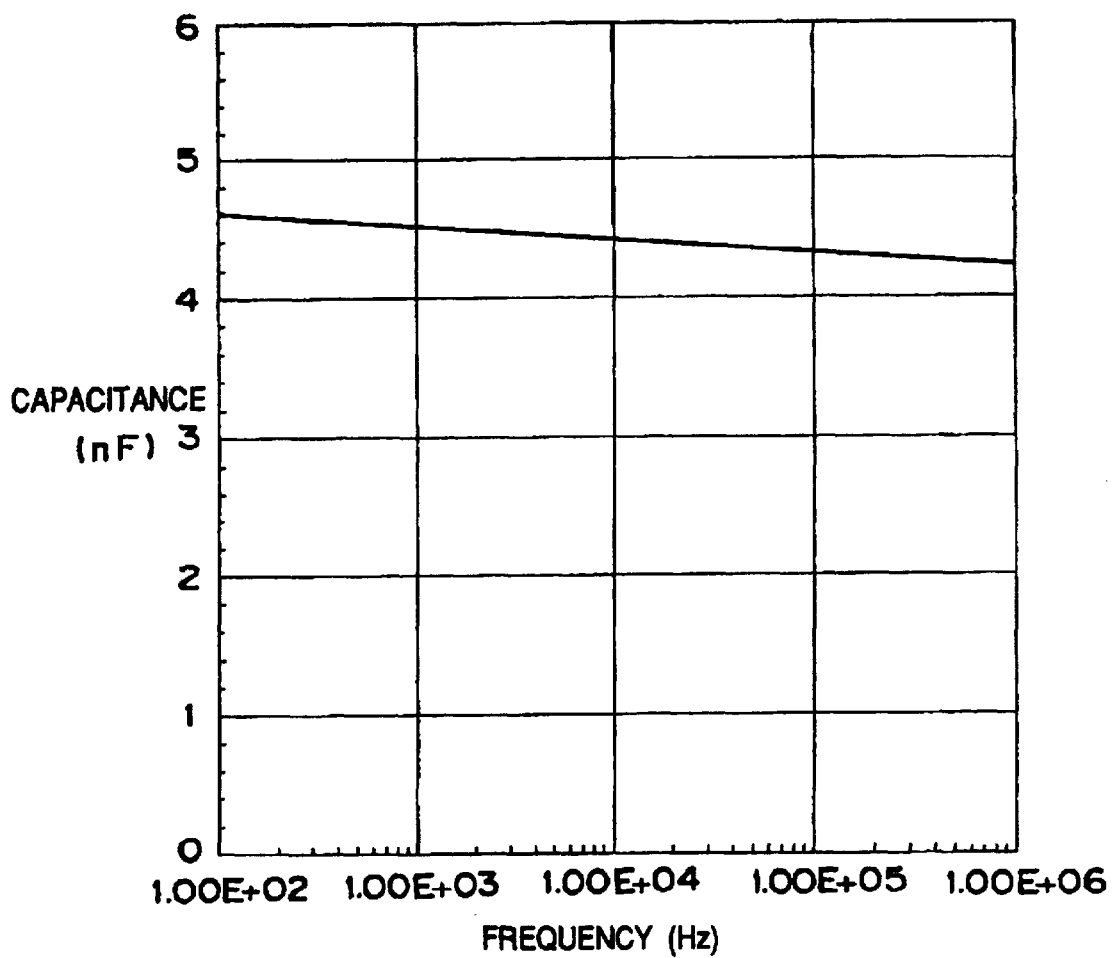
FIG. 12 is a graph showing a capacitance vs. frequency characteristic of a high dielectric thin film of the semiconductor storage device shown in FIG. 11.

FIG. 12 shows the dependence of the capacitance on the frequency of the high dielectric film 191 of the semiconductor storage device formed as described above. The area of the capacitor is 0.09 mm². As indicated in FIG. 12, the capacitance value is constant, namely, about 4.5 nF in a frequency range of $10^2$ Hz–$10^6$ Hz.

Figure 13:
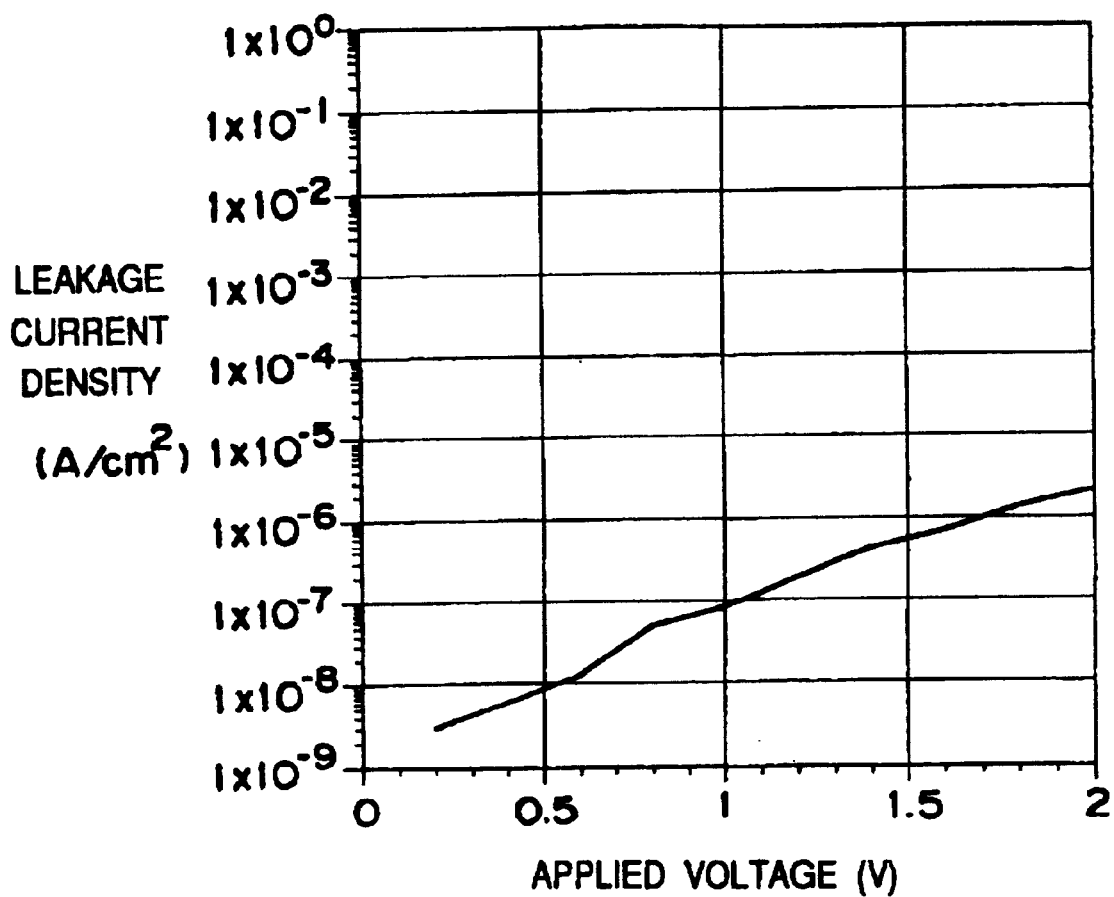
FIG. 13 is a graph showing a leakage current density vs. applied voltage characteristic of the high dielectric thin film of the semiconductor storage device shown in FIG. 11.

FIG. 13 shows the dependence of the leakage current density on the voltage of the high dielectric thin film 191. As indicated in FIG. 13, the leakage current density is of the order of $10^{-6}$ A/cm² at 2 V, which indicates that the high dielectric thin film 191 has low leakage current characteristics.

As is obvious from the above, the high dielectric thin film 191 provides preferable electric characteristics. This proves that the polysilicon plug 187 and the lower electrodes 188–190 contact each other closely.

The optimum total thickness of the lower electrodes 188–190 is 1300 Å, thus allowing the difference in level of the capacitor section to be smaller than in the conventional semiconductor storage device in which a barrier metal is interposed between the lower electrode and the polysilicon plug. Hence the inaccuracy in the photolithographic process can be suppressed.

In the above embodiments, the upper electrode UE of the capacitor section is formed of a combination of the PtRh film and the PtRhOx film, the PtRhOx film alone, or the PtRh film alone, or a combination of the Pt film and the PtRhOx film, similarly to the lower electrode LE. However, the same effects are obtainable even though the upper electrode UE is formed of only the Pt film having a thickness of 1000 Å.

In the above-mentioned embodiments and also in embodiments to be described later, if the lower electrode LE of the capacitor section is heat-treated in a nitrogen atmosphere at 400° C.–700° C. (preferably, 550° C.), the crystallizability of the lower electrode is improved. Consequently, it is possible to reduce the leakage current of the ferroelectric thin film or the high dielectric thin film formed on the lower electrode LE. However, if the heat-treatment is performed at a temperature of lower than 400° C., the crystallizability of the lower electrode is not improved. Also, if the heat-treatment is performed at a temperature of more than 700° C., the flatness of the surface of the lower electrode LE is damaged.

In the fourth embodiment or the seventh embodiment, a PtOx film or a PtRhOx film may be further formed by annealing the uppermost-layer lower electrode consisting of the PtRh film or the Pt film in an oxygen atmosphere to thereby oxidize the surface thereof, as done in the second and sixth embodiments.

In the fourth through eighth embodiments, the lowermost-layer lower electrode consisting of the PtRh film or the Pt film is formed directly on the polysilicon plug. By thus forming directly on the polysilicon plug a film of Pt or an alloy of Pt which are highly reactive with the polysilicon, contact between the polysilicon plug and the lower electrode is improved. Due to the close contact between the polysilicon plug and the lower electrode, the surface of the polysilicon plug is prevented from being oxidized by oxygen diffused from the PtRhOx film forming the lower electrode in the process of heat-treatment of the ferroelectric thin film.

However, because Pt in the PtRh film or the Pt film forming the lowermost-layer lower electrode is highly reactive with the polysilicon, a reaction tends to take place to form a silicide or the like in the process of forming the lower-most-layer lower electrode and in a later heat-treating process. Thus, it is necessary to set the film-forming temperature of the lower electrode to 250° C., which temperature is much lower than an optimum temperature. Therefore, it is difficult to obtain the lower electrode of a good film quality. Accordingly, the contact resistance between the polysilicon plug and the lower electrode is apt to be unstable or high.

In order to solve the problem, the following embodiments use tungsten (W), which is less reactive with Pt than silicon (Si) is, to form the plug.

(Tenth Embodiment)

Figure 14:
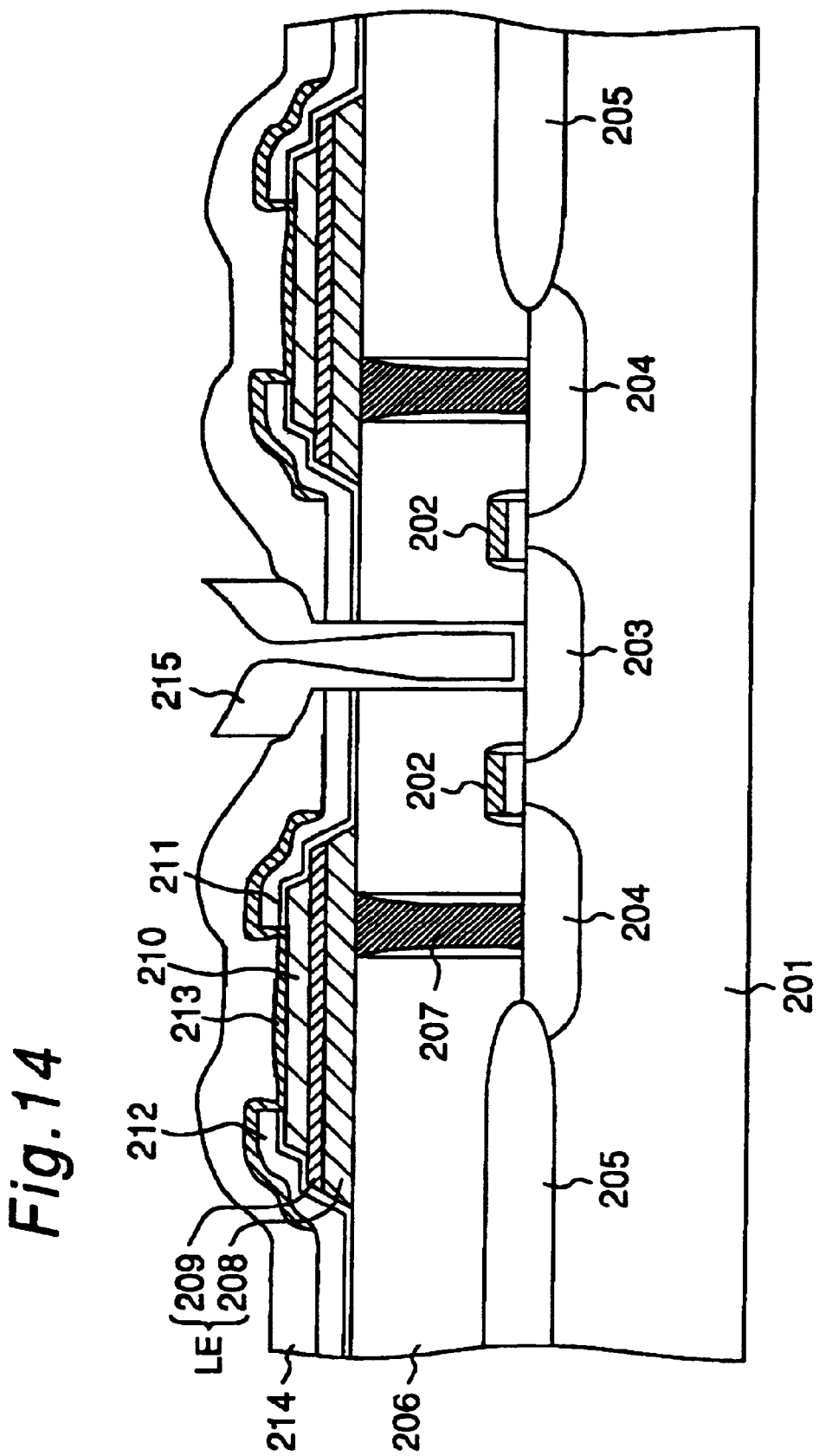
FIG. 14 is a sectional view showing a tenth embodiment of the semiconductor storage device of the present invention.

FIG. 14 is a sectional view showing a semiconductor storage device of the tenth embodiment.

A silicon substrate 201, a gate electrode 202, a source region 203, a drain region 204, a LOCOS oxide film 205, an interlaminar insulation film 206, a ferroelectric thin film 210, and an interlaminar insulation film 212 of the semiconductor storage device of the tenth embodiment have the same construction as that of the silicon substrate 21, the gate electrode 22, the source region 23, the drain region 24, the LOCOS oxide film 25, the interlaminar insulation film 26, the ferroelectric thin film 31, and the interlaminar insulation film 32 of the semiconductor storage device of the first embodiment shown in FIG. 1, respectively.

A tungsten plug 207 for connecting the drain region 204 of the CMOS section and the capacitor section with each other is formed in the interlaminar insulation film 206. A lower-layer lower electrode 208 consisting of a PtRh film and an upper-layer lower electrode 209 consisting of a PtRhOx film are formed on the interlaminar insulation film 206 and in the position of the tungsten plug 207. An upper electrode 213 consisting of a Pt film is formed in an upper position of the capacitor section.

To prevent the diffusion of oxygen gas and the occurrence of the silicide reaction, a titanium oxide film 211 is formed between the interlaminar insulation film 212 and the walls of the lower electrodes 208, 209 and ferroelectric thin film 210, between the upper surface of the ferroelectric thin film 210 and the interlaminar insulation film 212, and between the interlaminar insulation film 206 and the interlaminar insulation film 212.

Reference numeral 214 denotes a silicon oxide film formed as an insulation film, and reference numeral 215 denotes an aluminum lead electrode which contacts the source region 203.

The semiconductor storage device having the above construction is formed by the following procedure.

That is, in a procedure similar to that of the first embodiment, the LOCOS oxide film 205, the source region 203, the drain region 204, the gate electrode 202, and the interlaminar insulation film 206 are sequentially formed over the P-type silicon substrate 201.

Then, a contact hole having a diameter of 0.5 µm is formed in the interlaminar insulation film 206, using the photolithographic method and dry etching method. Then, tungsten is filled in the contact hole by the CVD method. Thereafter, the surface of the tungsten is flattened by the CMP method to thereby form the tungsten plug 207.

Then, using the DC magnetron sputtering method, a PtRh film having a thickness of 700 Å is deposited directly on the tungsten plug 207 at 450° C. to form the lower-layer lower electrode 208. Then, using the DC magnetron reactive sputtering method, a PtRhOx film having a thickness of 300 Å is formed on the lower-layer lower electrode 208 at 450° C. to form the upper-layer lower electrode 209.

In the tenth embodiment, because the plug is formed of W which is less reactive with Pt than Si is, a film-forming temperature for forming the lower electrodes 208 and 209 is able to be set to an optimum value. Therefore, in the tenth embodiment, the temperature for forming the lower electrodes 208 and 209 is set to 450° C., which temperature allows a good film quality to be achieved. Thus, the contact resistance between the tungsten plug 207 and the lower electrodes 208 and 209 is made a low, stable value.

The thickness of the PtRh film as the lower-layer lower electrode 208 is required to be 200 Å or more to prevent oxygen from permeating the PtRh film to the tungsten plug 207 to thereby oxidize the surface of the tungsten plug 207 in a later process of forming the PtRhOx film. The thickness of[00c6] the PtRhOx film as the upper-layer lower electrode 209 is required to be 300 Å or more to prevent the oxygen atmosphere from permeating to the tungsten plug 207 in forming the ferroelectric thin film 210. Accordingly, the entire thickness of the lower electrodes is required to be 500 Å or more. On the other hand, the entire thickness of the lower electrodes is required to be 2000 Å or less because a fine processing is performed in a later stage.

The ratio between the elements of the PtRh film 208 is Pt:Rh=80:20. The ratio between the elements of the PtRhOx film 209 is Pt:Rh:O=70:15:15. The PtRh film 208 and the PtRhOx film 209 are formed by adjusting the gas flow rates of all gases so that the flow ratio of argon to oxygen is Ar:O=2:1 and that the atmospheric pressure inside a reaction chamber is 10 mTorr.

If a Rh content in the PtRh film 208 is above 80%, the crystallizability of the Pt having an orientation of (111) as its main peak becomes unfavorable. Consequently, it is difficult for the PZT ferroelectric thin film 210 formed on the upper-layer lower electrode 209 to crystallize. In addition, the capacitor leakage current of the PZT film disadvantageously increases. Thus, it is necessary that the content of Rh in the PtRh film 208 is 80% or less.

If the content of Rh in the PtRhOx film 209 is less than 10%, oxygen cannot be blocked off sufficiently during the heat treatment. Further, if a content of oxygen in the PtRhOx film 209 is more than 40%, the crystallizability and morphology of the PtRhOx film 209 deteriorate and thus the PZT film 210 cannot be sufficiently crystallized. On the other hand, if the oxygen content in the PtRhOx film 209 is less than 5%, the oxygen stocking effect of the PtRhOx film 209 is reduced. More, specifically, when the ferroelectric thin film 210 is repeatedly subjected to polarization inversion, oxygen shortage occurs in the ferroelectric thin film 210 at a site in the vicinity of the upper-layer lower electrode 209. Thus, the ferroelectric thin film 210 does not display the ferroelectricity. Therefore, if the oxygen content in the PtRhOx film 209 is less than 5%, the oxygen stocking effect of the PtRhOx film 209 is reduced.

As described above, in the tenth embodiment, the tungsten plug 207 serving as a means for contacting the CMOS section and the capacitor section each other is formed of W which is less reactive with Pt than Si is. And, the PtRh film 208 is formed directly on the tungsten plug 207. Further, the PtRhOx film 209 is formed on the PtRh film 208. The PtRhOx film 209 functions as a block or barrier for preventing the diffusion of oxygen to the tungsten plug 207 in heat-treating the ferroelectric thin film 210 in an oxygen atmosphere. On the other hand, the PtRh film 208 functions as a block for preventing the diffusion of the oxygen to the tungsten plug 207 in forming the PtRhOx film 209.

The same target can be used in forming the PtRh film 208 on the tungsten plug 207 by the DC magnetron sputtering method and in forming the PtRhOx film 209 on the PtRh film 208 by the DC magnetron reactive sputtering method. Accordingly, the PtRh film 208 and the PtRhOx film 209 can be continuously formed, which simplifies the process.

Thereafter, a sol-gel method is used to form the PZT ferroelectric thin film 210 having a thickness of 2000 Å. The method of forming the PZT film is described below in detail.

Initially, a sol-gel feed solution consisting of 2-methoxyethanol serving as a solvent, lead acetate, titanium isopropoxide, and zirconium isopropoxide is prepared such that the content ratio among Pb, Ti, and Zr in the solution becomes 100:52:48. Then, using a spinner rotating at 3000 r.p.m., the solution is applied to a silicon wafer having the lower electrodes 208 and 209 formed thereon. Then, the applied film is dried in the atmosphere at 150° C. for 10 minutes and then, sintered temporarily in the atmosphere at 400° C. for 30 minutes. This process is repeated three to five times until the thickness of a resulting film becomes 2000 Å. Then, using the RTA method, heat treatment for crystallization of the film is carried out at 650° C. for 30 seconds in an atmosphere of combined nitrogen and oxygen. The ratio of the flow rate of nitrogen to that of oxygen is set to 4:1.

Then, the thus formed ferroelectric thin film (PZT film) 210 and the lower electrodes 208 and 209 are processed to the size of 2.6 μm square by the dry etching method. Then, a silicon oxide film is formed as the interlaminar insulation film 212 by the CVD method. Then, a contact hole is formed through the interlaminar insulation film 212 formed on the ferroelectric thin film 210.

Then, a Pt film having a thickness of 1000 Å is formed as the upper electrode 213 on the capacitor section by the DC magnetron sputtering method.

Then, the upper electrode 213 is processed by the dry etching method, using a chlorine gas. And then, a silicon oxide film as the insulation film 214 is formed by the CVD method. Then, a contact hole is formed above the source region 203 of the CMOS section, and the lead electrode 215 of the source region 203 is formed of aluminum by the DC magnetron sputtering method.

Figure 15:
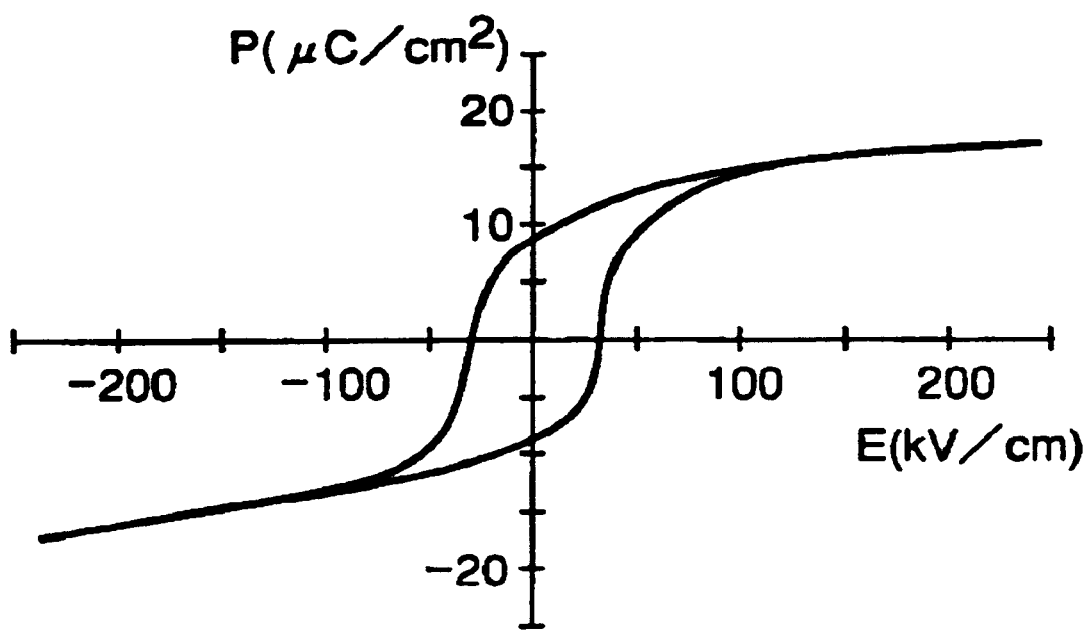
FIG. 15 is a graph showing a ferroelectric characteristic of the semiconductor storage device shown in FIG. 14.

A triangular wave was applied between the lead electrode 215 and the upper electrode 213 of the capacitor section having the ferroelectric substance to determine the ferroelectric characteristics. The peak values of the triangular wave were 1 V and 5 V, and the frequency thereof was 78 Hz. The result was that as shown in FIG. 15, a saturated polarization value Ps at 5 V was 15.2 $\mu C/cm^2$ and Pr=8.8 $\mu C/cm^2$. That is, the ferroelectric characteristic value was large enough to be used as the ferroelectric capacitor. Further, a symmetric hysteresis loop was obtained. This proves that the tungsten plug 207 and the lower electrodes 208 and 209 contact each other closely.

As described above, in the tenth embodiment, because the lower electrode LE formed on the tungsten plug 207 consists of the PtRh film 208 and the PtRhOx film 209, the PtRhOx film blocks the diffusion of oxygen to the tungsten plug 207 in forming the ferroelectric thin film 210. Thus, the surface of the tungsten plug 207 is prevented from being oxidized, which allows the capacitor section and the CMOS section to contact each other closely.

Consequently, it is unnecessary to provide the semiconductor storage device with a barrier metal of TiN which was required in the conventional semiconductor storage device. Hence, the difference in level, or unevenness, of the capacitor section is allowed to be small.

Further, because the PtRh film 208 is formed directly on the tungsten plug 207, it is possible to prevent oxygen from diffusing to the tungsten plug 207 in forming the PtRhOx film 209. Therefore, the contact between the capacitor section and the CMOS section is further improved.

In this case, because W is less reactive with Pt than Si is, the W of the tungsten plug 207 and the Pt of the PtRh film 208 do not react with each other in forming the PtRh film 208 and in heat-treating the ferroelectric thin film 210. Accordingly, the film-forming temperature of the lower electrodes 208 and 209 can be set to 450° C., so that the lower electrodes 208 and 209 having a fine film quality are obtained. That is, in the tenth embodiment, the contact resistance between the tungsten plug 207 and the lower electrodes 208 and 209 is set to a low and stable value.

In the present embodiment, a PtRh film is formed as the lower-layer lower electrode 208 to prevent oxygen from diffusing to the tungsten plug 207 from the PtRhOx film 209 in heat-treating the ferroelectric thin film 210. However, the PtRh film 208 may be replaced with the Pt film. In this case also, the same effect is obtained. In using the Pt film, it is possible to successively form the Pt film by the DC magnetron sputtering method and the PtRhOx film in the DC magnetron reactive sputtering method by using different targets. The film forming process can thus be simplified.

(Eleventh Embodiment)

In the tenth embodiment, the lower electrode LE of the capacitor section is formed of two layers of the PtRh film and the PtRhOx film, whereas in the eleventh embodiment, the lower electrode LE of the capacitor section is formed of three layers of a PtRh film, a PtRhOx film, and a Pt film.

Figure 16:
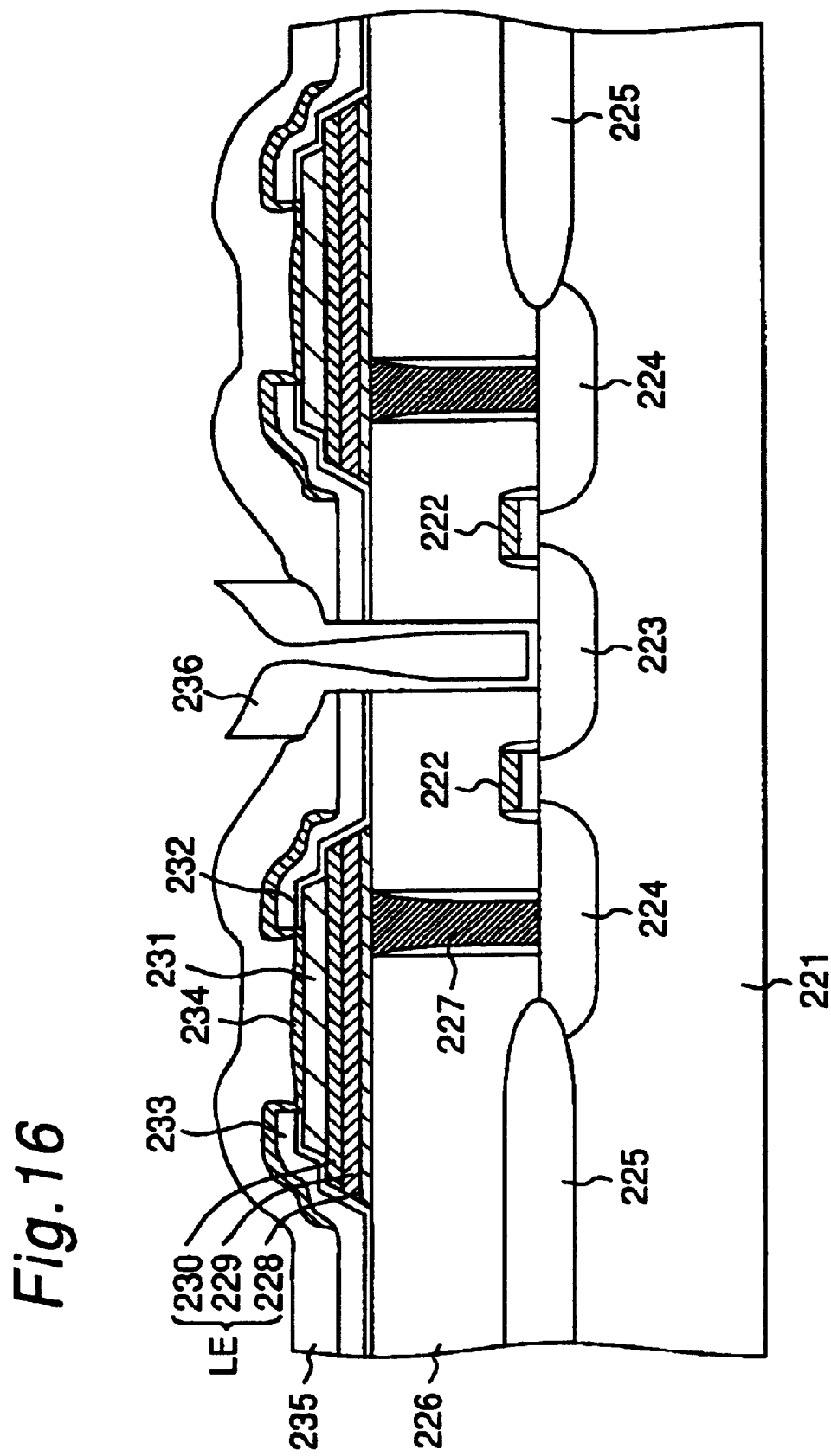
FIG. 16 is a sectional view showing an eleventh embodiment of the semiconductor storage device of the present invention.

FIG. 16 is a sectional view showing the semiconductor storage device of the eleventh embodiment.

A silicon substrate 221, a gate electrode 222, a source region 223, a drain region 224, a LOCOS oxide film 225, an interlaminar insulation film 226, a ferroelectric thin film 231, and an interlaminar insulation film 233 of the semiconductor storage device of the eleventh embodiment have the same construction as that of the silicon substrate 21, the gate electrode 22, the source region 23, the drain region 24, the LOCOS oxide film 25, the interlaminar insulation film 26, the ferroelectric thin film 31, and the interlaminar insulation film 32 of the semiconductor storage device as shown in FIG. 1, respectively.

A tungsten plug 227 is formed in the interlaminar insulation film 226. There are formed, on the interlaminar insulation film 226 and in the position of the tungsten plug 227, a lowermost-layer lower electrode 228 consisting of the PtRh film, an intermediate-layer lower electrode 229 consisting of the PtRhOx film, and an uppermost-layer lower electrode 230 consisting of the Pt film. An upper electrode 234 consisting of a Pt film is formed in an upper position of the capacitor section.

A titanium oxide film 232 is formed between the interlaminar insulation film 233 and the walls of the lower electrodes 228, 229, 230 and ferroelectric thin film 231, between the upper surface of the ferroelectric thin film 231 and the interlaminar insulation film 233, and between the interlaminar insulation film 226 and the interlaminar insulation film 233.

Reference numeral 235 denotes an insulation film (a silicon oxide film), and reference numeral 236 denotes an aluminum lead electrode.

The semiconductor storage device having the above construction is formed by the following procedure.

That is, in a procedure similar to that of the tenth embodiment, the LOCOS oxide film 225, the source region 223, the drain region 224, the gate electrode 222, and the interlaminar insulation film 226 are sequentially formed on the P-type silicon substrate 221. Further, the tungsten plug 227 is formed in the interlaminar insulation film 226. Then, the PtRh film 228 as the lowermost-layer lower electrode is formed directly on the tungsten plug 227, and the PtRhOx film 229 as the intermediate-layer lower electrode is formed on the PtRh film 228.

The thicknesses of the PtRh film 228 and the PtRhOx film 229, and the content ratios of the elements of the PtRh film 228 and the PtRhOx film 229 are limited for the reasons as described in the tenth embodiment.

Then, using the DC magnetron sputtering method, a Pt film having a thickness of 500 Å is formed as the uppermost-layer lower electrode 230 on the intermediate-layer lower electrode 229 at 450° C. Because the Pt film having a sharp orientation (111) is formed as the uppermost layer of the lower electrode, the PZT film formed on the uppermost-layer lower electrode 230 has a favorable crystallizability and hence the ferroelectric characteristic and leakage current characteristics are improved.

Then, in a procedure similar to that of the tenth embodiment, the ferroelectric thin film 231, the upper electrode 234, the insulation film 235, and the lead electrode 236 are formed.

The ferroelectric characteristic of the thus formed semiconductor storage device was determined by a method similar to the tenth embodiment. As a result, a symmetric hysteresis loop having values of Ps=43.4 $\mu C/cm^2$ and Pr=23.4 $\mu C/cm^2$ was obtained. That is, ferroelectric characteristic values large enough to be used as the ferroelectric capacitor was obtained. This proves that the tungsten plug 227 and the lower electrodes 228, 229, and 230 contact each other closely.

The optimum sum of the thicknesses of the lower electrodes 228, 229, and 230 is 1500 Å. Thus, the difference in level of the capacitor section is allowed to be smaller than that of the conventional capacitor section in which a barrier metal is interposed between the polysilicon plug and the lower electrode. Hence the errors occurring in the photolithographic process are reduced.

As described above, in the eleventh embodiment, because the plug for contacting the capacitor section and the CMOS section each other is formed of W, the W of the tungsten plug 227 and the Pt of the PtRh film 228 hardly react with each other in forming the PtRh film 228 and in heat-treating the ferroelectric thin film 231. Accordingly, the film-forming temperature for the lower electrodes 228, 229, and 230 can be set to 450° C. to obtain the lower electrodes having a good film quality. That is, the contact resistance between the tungsten plug and the lower electrodes is set to low and stable values.

In addition, because the Pt film having an orientation (111) is formed as the uppermost layer of the lower electrode, it is possible to form the PZT film having a favorable crystallizability and hence improve the ferroelectric characteristics and the leakage current characteristics.

In the eleventh embodiment, the PtRh film 228 is formed as the lowermost-layer lower electrode to prevent oxygen from diffusing to the tungsten plug 227 in forming the PtRhOx film 209. Further, the Pt film 230 is formed as the uppermost-layer lower electrode to improve the characteristics of the ferroelectric thin film 231. However, it is possible to obtain similar effects even though the lower electrode LE is formed of the Pt film, the PtRhOx film and the Pt or PtRh film laminated in this order from the tungsten plug 227 side.

In the first through eighth embodiments, and the tenth and eleventh embodiments, a ferroelectric substance of PZT is used to form the ferroelectric thin film, but alternatively it is also possible to use the following substances: $PbTiO_3$, $(Pb_xLa_{1-x})TiO_3$ ($0 \leq x \leq 1$), $(Pb_xLa_{1-x})(Zr_yTi_{1-y})O_3$ ($0 \leq x \leq 1$, $0 \leq y \leq 1$), $Bi_4Ti_3O_{12}$, $BaTiO_3$, $BaMgF_4$, $LiNbO_3$, $LiTaO_3$, $SrBi_2Ti_2O_9$, $YMnO_3$, $Sr_2Nb_2O_7$, $La_2Ti_2O_7$, and $SrBi_2(Ta_xNb_{1-x})_2O_9$ ($0 \leq x \leq 1$). With these substances, similar effects are obtained. Further, it is possible to obtain similar effects even though $(Ba_xSr_{1-x})TiO_3$ ($0 \leq x \leq 1$), a high dielectric substance, is used as in the ninth embodiment.

Although the sol-gel method and the sputtering method are used in the above embodiments as the film-forming method, the MOD (metal organic deposition) method, the vacuum vaporization method, the MOCVD (metal organic CVD) method, or the reactive magnetron sputtering method may be used.

Further, although the P-type silicon substrate is used as the silicon substrate in the above embodiments, similar effects are obtained even though an N-type silicon substrate is used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device having a stack construction, comprising:
    a capacitor section having an upper electrode, a dielectric layer, and a lower electrode; and
    a transistor section connected with the capacitor section with a plug,
    wherein said lower electrode is formed directly on said plug, and is formed of one or more materials selected from the group consisting of platinum, platinum-rhodium alloys and oxides of platinum-rhodium alloys, wherein at least an oxide of a platinum-rhodium alloy is selected from said group.

2. The semiconductor storage device according to claim 1, wherein said plug is formed of polysilicon, and said lower electrode comprises a film of an oxide of a platinum-rhodium alloy, a film of a platinum-rhodium alloy, and a film of an oxide of a platinum-rhodium alloy which are sequentially stacked in this order on said plug.

3. The semiconductor storage device according to claim 1, wherein said plug is formed of polysilicon, and said lower electrode comprises a film of an oxide of a platinum-rhodium alloy and a film of a platinum-rhodium alloy which are sequentially formed on said plug.

4. The semiconductor storage device according to claim 1, wherein said plug is formed of polysilicon, and said lower electrode is formed of a film of an oxide of a platinum-rhodium alloy.

5. The semiconductor storage device according to claim 1, wherein said plug is formed of tungsten.

6. The semiconductor storage device according to claim 5, wherein said lower electrode comprises one of a film of platinum and a film of a platinum-rhodium alloy, and a film of an oxide of a platinum-rhodium alloy which are sequentially formed on said tungsten plug.

7. The semiconductor storage device according to claim 6, wherein said lower electrode further comprises one of a film of platinum and a film of a platinum-rhodium alloy formed on said film of the oxide of a platinum-rhodium alloy.

8. A semiconductor storage device comprising:
    a capacitor comprising first and second electrodes insulated from each other by a dielectric layer;
    a transistor comprising source and drain regions formed in a substrate and a gate electrode insulated from the portion of said substrate between said source and drain regions; and a conductor electrically connecting one of said source and drain regions of said transistor to said first electrode of said capacitor,
wherein said first electrode of said capacitor is in direct contact with said conductor and said first electrode comprises at least an oxide of a platinum-rhodium alloy.

9. The semiconductor storage device according to claim 8, wherein the oxide of a platinum-rhodium alloy has an oxygen content of between 2% and 30%.

10. The semiconductor storage device according to claim 8, wherein said conductor is formed of polysilicon and said first electrode of said capacitor comprises a first film of an oxide of a platinum-rhodium alloy, a second film of a platinum-rhodium alloy, and a third film of an oxide of a platinum-rhodium alloy.

11. The semiconductor storage device according to claim 10, wherein said first film has a thickness between 100 Å and 500 Å, said second film has a thickness between 200 Å and 1000 Å and said third film has a thickness between 200 Å and 1000 Å.

12. The semiconductor storage device according to claim 10, wherein the ratio between the elements of the second film of a platinum-rhodium alloy is 90:10.

13. The semiconductor storage device according to claim 8, wherein said conductor is formed of polysilicon and said first electrode of said capacitor comprises a first film of an oxide of a platinum-rhodium alloy and a second film of a platinum-rhodium alloy.

14. The semiconductor storage device according to claim 8, wherein said conductor is formed of polysilicon and said first electrode of said capacitor is formed entirely of an oxide of a platinum-rhodium alloy.

15. The semiconductor storage device according to claim 8, wherein said conductor is formed of tungsten and said first electrode of said capacitor comprises one of a film of platinum in direct contact with said conductor and a film of a platinum-rhodium alloy in direct contact with said conductor, and a film of an oxide of a platinum-rhodium alloy.

16. The semiconductor storage device according to claim 15, wherein said first electrode of said capacitor further comprises one of a film of platinum and a film of a platinum-rhodium alloy formed on said film of an oxide of a platinum-rhodium alloy.

17. The semiconductor storage device according to claim 8, wherein said first electrode of said capacitor comprises a first film of platinum in direct contact with said conductor and a second film of an oxide of a platinum-rhodium alloy.

18. The semiconductor storage device according to claim 17, wherein said first electrode of said capacitor further comprises a third film of platinum.

19. The semiconductor storage device according to claim 8, wherein said second electrode of said capacitor comprises an oxide of a platinum-rhodium alloy.

20. A semiconductor storage device comprising:
a capacitor comprising first and second electrodes insulated from each other by a dielectric layer, said first electrode comprising at least an oxide of a platinum-rhodium alloy; and
a transistor electrically connected to said capacitor, said transistor comprising source and drain regions formed in a substrate and a gate electrode insulated from the portion of said substrate between said source and drain regions.

21. The semiconductor storage device according to claim 20, wherein the oxide of a platinum-rhodium alloy has an oxygen content of between 2% and 30%.

22. The semiconductor storage device according to claim 20, wherein
said transistor is electrically connected to said capacitor by a conductive layer that is in direct contact with said first electrode of said capacitor, and
said first electrode of said capacitor is composed of a first film of an oxide of a platinum-rhodium alloy, a second film of platinum-rhodium alloy formed on said first film, and a third film of an oxide of a platinum-rhodium alloy formed on said second film.

23. The semiconductor storage device according to claim 22, wherein said first film has a thickness between 100 Å and 500Å, said second film has a thickness between 200 Å and 1000 Å, and said third film has a thickness between 200 Å and 1000 Å.

24. The semiconductor storage device according to claim 22, wherein the ratio between the elements of the second film of a platinum-rhodium alloy is Pt:Rh=90:10.

25. The semiconductor storage device according to claim 20, wherein
said transistor is electrically connected to said capacitor by a conductive layer that is in direct contact with said first electrode of said capacitor, and
said first electrode of said capacitor is composed of a first film of an oxide of a platinum-rhodium alloy and a second film of a platinum-rhodium alloy formed on said first film.

26. The semiconductor storage device according to claim 20, wherein said first electrode of said capacitor is composed entirely of an oxide of a platinum-rhodium alloy.

27. The semiconductor storage device according to claim 20, wherein said transistor is electrically connected to said capacitor by a conductive layer that is in direct contact with said first electrode of said capacitor, and
said first electrode of said capacitor is composed of a first film of a platinum-rhodium alloy, a second film of an oxide of a platinum-rhodium alloy formed on said first film, and a third film of a platinum-rhodium alloy formed on said second film.

28. The semiconductor storage device according to claim 20, wherein
said transistor is electrically connected to said capacitor by a conductive layer that is in direct contact with said first electrode of said capacitor, and
said first electrode of said capacitor is composed of a first film of a platinum-rhodium alloy and a second film of an oxide of a platinum-rhodium alloy formed on said first film.

29. The semiconductor storage device according to claim 28, wherein said conductive layer comprises a polysilicon.

30. The semiconductor storage device according to claim 28, wherein said conductive layer comprises tungsten.

31. The semiconductor storage device according to claim 30, wherein the ratio between the elements of the platinum-rhodium alloy is Pt:Rh=80:20.

32. The semiconductor storage device according to claim 30, wherein the ratio between the elements of the oxide of a platinum-rhodium alloy is Pt:Rh:O=70:15:15.

33. The semiconductor storage device according to claim 20, wherein
said transistor is electrically connected to said capacitor by a conductive layer that is in direct contact with said first electrode of said capacitor, and
said first electrode of said capacitor is composed of a first film of a platinum-rhodium alloy, a second film of an oxide of a platinum-rhodium alloy formed on said first film, and a third film of platinum formed on said second film.

34. The semiconductor storage device according to claim 33, wherein said conductive layer comprises tungsten.

35. The semiconductor storage device according to claim 20, wherein
said transistor is electrically connected to said capacitor by a conductive layer that is in direct contact with said first electrode of said capacitor, and
said first electrode of said capacitor is composed of a first film of platinum, a second film of an oxide of a platinum-rhodium alloy formed on said first film, and a third film of platinum formed on said second film.

36. The semiconductor storage device according to claim 20, wherein
said transistor is electrically connected to said capacitor by a conductive layer that is in direct contact with said first electrode of said capacitor, and
said first electrode of said capacitor is composed of a first film of platinum and a second film of an oxide of a platinum-rhodium alloy formed on said first film.

37. The semiconductor storage device according to claim 20, wherein said second electrode of said capacitor comprises an oxide of a platinum-rhodium alloy.

38. The semiconductor storage device according to claim 20, wherein said dielectric layer comprises $PbZr_xTi_{1-x}O_3$ ($0 \leq x \leq 1$).

39. The semiconductor storage device according to claim 20, wherein said dielectric layer comprises $(Ba_xSr_{1-x})TiO_3$ ($0 \leq x \leq 1$).

40. The semiconductor storage device according to claim 20, wherein said dielectric layer comprises a material selected from the group consisting of: $PbTiO_3$; $(Pb_xLa_{1-x})TiO_3$ ($0 \leq x \leq 1$); $(Pb_xLa_{1-x})(Zr_yTi_{1-y})O_3$ ($0 \leq x \leq 1, 0 \leq y \leq 1$); $Bi_4Ti_3O_{12}$;, $BaTiO_3$; $BaMgF_4$; $LiNbO_3$; $LiTaO_3$; $SrBi_2Ti_2O_9$; $YmnO_3$, $Sr_2Nb_2O_7$; $La_2Ti_2O_7$; and $SrBi_2(Ta_xNb_{1-x})_2O_9$ ($0 \leq x \leq 1$).

* * * * *